US008693877B2

(12) United States Patent
Tam et al.

(10) Patent No.: US 8,693,877 B2
(45) Date of Patent: Apr. 8, 2014

(54) INTEGRATED INFRARED RECEIVER AND EMITTER FOR MULTIPLE FUNCTIONALITIES

(75) Inventors: John Tam, Cupertino, CA (US); David Tupman, San Francisco, CA (US); Steve Hotelling, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 896 days.

(21) Appl. No.: 11/871,725

(22) Filed: Oct. 12, 2007

(65) Prior Publication Data

US 2008/0219672 A1    Sep. 11, 2008

Related U.S. Application Data

(60) Provisional application No. 60/906,124, filed on Mar. 9, 2007.

(51) Int. Cl.
*H04B 10/00* (2013.01)
*H04M 1/02* (2006.01)

(52) U.S. Cl.
USPC ............. 398/130; 398/118; 398/128; 455/73; 455/555; 455/556.1

(58) Field of Classification Search
USPC ...................... 398/75, 76, 118–131
See application file for complete search history.

(56) References Cited

U.S. PATENT DOCUMENTS

| 5,095,945 A * | 3/1992 | Jensen ........................... 137/607 |
| 5,103,085 A | 4/1992 | Zimmerman |
| 5,270,818 A | 12/1993 | Ottenstein |
| 5,406,305 A | 4/1995 | Shimomura et al. |
| 5,528,266 A | 6/1996 | Arbeitman et al. |
| 5,684,294 A | 11/1997 | Kouhi |

(Continued)

FOREIGN PATENT DOCUMENTS

| CN | 1581052 | 2/2005 |
| CN | 1828711 | 9/2006 |

(Continued)

OTHER PUBLICATIONS

Masaki Translation.*

(Continued)

*Primary Examiner* — Oommen Jacob
(74) *Attorney, Agent, or Firm* — Blakely, Sokoloff, Taylor & Zafman LLP

(57) ABSTRACT

Apparatuses and methods to detect and emit various infrared (IR) and ambient light signals using an integrated sensor and emitter device. Embodiments include a sensor to sense proximity, to sense IR data signals, and to sense ambient light; and an emitter of an IR proximity signal. The sensor detects the IR proximity signal from the emitter when the apparatus is sensing proximity, detects IR data signals when the apparatus is detecting IR data, and detects ambient light when the apparatus sensing light. The IR data signals may include IR remote control (IR RC) and/or IR data association (IRDA) signals. The signals may be detected simultaneously and may be in different frequency bands. According to embodiments, such an emitter may also emit an IR data signals, such as IR RC and/or IRDA signals. These signals may be emitted simultaneously and may be in different frequency bands.

30 Claims, 15 Drawing Sheets

(56) References Cited

U.S. PATENT DOCUMENTS

| | | | |
|---|---|---|---|
| 5,786,801 A | 7/1998 | Ichise | |
| 5,884,156 A * | 3/1999 | Gordon | 455/321 |
| 5,894,298 A | 4/1999 | Hoeksma | |
| 5,952,992 A | 9/1999 | Helms | |
| 6,018,674 A * | 1/2000 | Aronow | 600/322 |
| 6,208,854 B1 | 3/2001 | Roberts et al. | |
| 6,246,862 B1 | 6/2001 | Grivas et al. | |
| 6,289,453 B1 | 9/2001 | Walker et al. | |
| 6,373,612 B1 | 4/2002 | Hoffman et al. | |
| 6,477,374 B1 | 11/2002 | Shaffer et al. | |
| 6,520,013 B1 | 2/2003 | Wehrenberg | |
| 6,522,697 B1 * | 2/2003 | Spickermann | 375/271 |
| 6,583,676 B2 | 6/2003 | Krah et al. | |
| 6,601,012 B1 | 7/2003 | Horvitz et al. | |
| 6,664,744 B2 | 12/2003 | Dietz | |
| 6,724,994 B1 * | 4/2004 | Collings et al. | 398/75 |
| 6,803,920 B2 | 10/2004 | Gossett et al. | |
| 6,812,466 B2 | 11/2004 | O'Connor et al. | |
| 6,822,635 B2 | 11/2004 | Shahoian et al. | |
| 6,947,017 B1 | 9/2005 | Gettemy | |
| 6,947,571 B1 | 9/2005 | Rhoads et al. | |
| 6,956,564 B1 | 10/2005 | Williams | |
| 7,016,705 B2 | 3/2006 | Bahl et al. | |
| 7,019,622 B2 | 3/2006 | Orr et al. | |
| 7,117,021 B2 | 10/2006 | Shearer et al. | |
| 7,117,380 B2 | 10/2006 | Kangas | |
| 7,171,221 B1 | 1/2007 | Amin et al. | |
| 7,177,664 B2 | 2/2007 | Weinzweig et al. | |
| 7,209,719 B2 * | 4/2007 | Liebenow | 455/127.1 |
| 7,522,065 B2 | 4/2009 | Falcon | |
| 7,605,693 B2 | 10/2009 | Kulas | |
| 7,633,076 B2 | 12/2009 | Huppi et al. | |
| 2001/0031633 A1 | 10/2001 | Tuomela et al. | |
| 2001/0031645 A1 | 10/2001 | Jarrett | |
| 2002/0018050 A1 * | 2/2002 | Turner | 345/169 |
| 2002/0019249 A1 | 2/2002 | Kashu et al. | |
| 2002/0065099 A1 * | 5/2002 | Bjorndahl | 455/553 |
| 2002/0167488 A1 | 11/2002 | Hinckley et al. | |
| 2003/0022666 A1 | 1/2003 | Sato | |
| 2003/0022671 A1 | 1/2003 | Huomo et al. | |
| 2003/0095096 A1 | 5/2003 | Robbin et al. | |
| 2003/0108300 A1 * | 6/2003 | Walker et al. | 385/53 |
| 2003/0224726 A1 | 12/2003 | Shearer et al. | |
| 2004/0012556 A1 | 1/2004 | Yong et al. | |
| 2004/0063452 A1 | 4/2004 | Tomoda | |
| 2004/0110472 A1 * | 6/2004 | Witkowski et al. | 455/41.2 |
| 2004/0180649 A1 | 9/2004 | Vogel et al. | |
| 2004/0203351 A1 | 10/2004 | Shearer et al. | |
| 2004/0213576 A1 * | 10/2004 | Tan et al. | 398/140 |
| 2004/0224638 A1 | 11/2004 | Fadell et al. | |
| 2004/0233153 A1 | 11/2004 | Robinson | |
| 2004/0245438 A1 | 12/2004 | Payne et al. | |
| 2005/0057169 A1 * | 3/2005 | Noguchi et al. | 315/150 |
| 2005/0104908 A1 | 5/2005 | Brown Elliott | |
| 2005/0132416 A1 * | 6/2005 | Wasilewski | 725/133 |
| 2005/0143057 A1 | 6/2005 | Shiraga et al. | |
| 2005/0168658 A1 * | 8/2005 | Woolgar et al. | 348/734 |
| 2005/0171662 A1 | 8/2005 | Strege et al. | |
| 2005/0190142 A1 | 9/2005 | Ferguson | |
| 2005/0219223 A1 | 10/2005 | Kotzin et al. | |
| 2005/0219228 A1 | 10/2005 | Alameh et al. | |
| 2005/0219394 A1 | 10/2005 | Du et al. | |
| 2005/0221791 A1 | 10/2005 | Angelhag | |
| 2005/0253817 A1 | 11/2005 | Rytivaara et al. | |
| 2006/0007107 A1 | 1/2006 | Ferguson | |
| 2006/0017692 A1 | 1/2006 | Wehrenberg et al. | |
| 2006/0026521 A1 | 2/2006 | Hotelling et al. | |
| 2006/0026535 A1 | 2/2006 | Hotelling et al. | |
| 2006/0052141 A1 | 3/2006 | Suzuki | |
| 2006/0060762 A1 | 3/2006 | Chan et al. | |
| 2006/0081771 A1 | 4/2006 | Eliad Wardimon | |
| 2006/0082057 A1 | 4/2006 | Luciano | |
| 2006/0087245 A1 | 4/2006 | Ng et al. | |
| 2006/0097991 A1 | 5/2006 | Hotelling et al. | |
| 2006/0116175 A1 | 6/2006 | Chu | |
| 2006/0117108 A1 | 6/2006 | Salisbury et al. | |
| 2006/0146012 A1 | 7/2006 | Arneson et al. | |
| 2006/0161870 A1 | 7/2006 | Hotelling et al. | |
| 2006/0161871 A1 | 7/2006 | Hotelling et al. | |
| 2006/0164241 A1 | 7/2006 | Makela et al. | |
| 2006/0166702 A1 | 7/2006 | Dietz et al. | |
| 2006/0197753 A1 | 9/2006 | Hotelling | |
| 2006/0199536 A1 | 9/2006 | Eisenbach | |
| 2006/0229101 A1 | 10/2006 | LaBauve et al. | |
| 2006/0252470 A1 | 11/2006 | Seshadri et al. | |
| 2006/0290921 A1 | 12/2006 | Hotelling | |
| 2006/0291863 A1 * | 12/2006 | Chan et al. | 398/115 |
| 2007/0003289 A1 * | 1/2007 | Tan et al. | 398/164 |
| 2007/0004473 A1 | 1/2007 | Clark et al. | |
| 2007/0042714 A1 | 2/2007 | Ayed | |
| 2007/0046629 A1 * | 3/2007 | Chi-Boon et al. | 345/158 |
| 2007/0057773 A1 | 3/2007 | Hsieh et al. | |
| 2007/0065134 A1 * | 3/2007 | Sugimoto | 396/165 |
| 2007/0075965 A1 | 4/2007 | Huppi et al. | |
| 2007/0085157 A1 | 4/2007 | Fadell et al. | |
| 2007/0088812 A1 | 4/2007 | Clark | |
| 2007/0099574 A1 | 5/2007 | Wang | |
| 2007/0123171 A1 * | 5/2007 | Slamka et al. | 455/66.1 |
| 2007/0123287 A1 | 5/2007 | Mock et al. | |
| 2007/0135091 A1 | 6/2007 | Wassingbo | |
| 2007/0135151 A1 | 6/2007 | Dendy | |
| 2007/0138493 A1 * | 6/2007 | Morimoto et al. | 257/95 |
| 2007/0161410 A1 | 7/2007 | Huang et al. | |
| 2007/0225047 A1 | 9/2007 | Bakos | |
| 2007/0233759 A1 | 10/2007 | Tomlinson et al. | |
| 2007/0239903 A1 | 10/2007 | Bhardwaj et al. | |
| 2007/0266185 A1 | 11/2007 | Goddi et al. | |
| 2007/0293188 A1 | 12/2007 | Houghton et al. | |
| 2008/0006762 A1 | 1/2008 | Fadell et al. | |
| 2008/0031206 A1 * | 2/2008 | Sharma | 370/338 |
| 2008/0090537 A1 * | 4/2008 | Sutardja | 455/232.1 |
| 2008/0090617 A1 | 4/2008 | Sutardja | |
| 2008/0102882 A1 | 5/2008 | Sutardja | |
| 2008/0113618 A1 | 5/2008 | De Leon et al. | |
| 2008/0192129 A1 | 8/2008 | Walker et al. | |
| 2009/0047904 A1 | 2/2009 | Preston et al. | |
| 2009/0098865 A1 | 4/2009 | Vaghi et al. | |
| 2009/0244092 A1 | 10/2009 | Hotelling | |
| 2009/0313473 A1 | 12/2009 | Walker et al. | |
| 2010/0105391 A1 | 4/2010 | Bennett et al. | |

FOREIGN PATENT DOCUMENTS

| | | |
|---|---|---|
| EP | 0992969 | 4/2000 |
| EP | 1185058 | 3/2002 |
| EP | 1335430 | 8/2003 |
| EP | 1355223 | 10/2003 |
| EP | 1 445 922 A1 | 8/2004 |
| EP | 1452988 | 9/2004 |
| EP | 1465462 | 10/2004 |
| EP | 1507132 | 2/2005 |
| EP | 1507196 | 2/2005 |
| EP | 1650938 | 4/2006 |
| EP | 1667103 | 6/2006 |
| EP | 1696414 | 8/2006 |
| GB | 2346500 | 8/2000 |
| GB | 2418808 | 4/2006 |
| JP | 05-323277 | 12/1993 |
| JP | 9146073 | 6/1997 |
| JP | 2001244498 A * | 9/2001 |
| JP | 2001-352395 | 12/2001 |
| JP | 2003-204390 | 7/2003 |
| JP | 2004-021476 | 1/2004 |
| JP | 2004159028 | 6/2004 |
| JP | 2004357193 | 12/2004 |
| JP | 2005-260996 | 9/2005 |
| JP | 2005-278043 | 10/2005 |
| JP | 2007-163872 | 6/2007 |
| WO | WO 00/79766 A1 | 12/2000 |
| WO | WO 2004/055769 A1 | 7/2004 |
| WO | WO-2004/093045 | 10/2004 |

(56) References Cited

FOREIGN PATENT DOCUMENTS

| WO | WO 2005071759 A1 * | 8/2005 |
|---|---|---|
| WO | WO-2005/101176 | 10/2005 |
| WO | WO 2005/114369 A2 | 12/2005 |

OTHER PUBLICATIONS

IrDA Physical Layer Implementation for Hewlett Pacards Infrared Products.*
morimoto_international_bib.*
Agilent Technologies Inc., "Agilent unveils optical proximity sensor for mobile appliances", http:/www.embeddedstar.com/press/content/2004/8/embedded16015.html, (Aug. 31, 2004),2 pages.
Apple Inc., "PCT Notification of Transmittal of the International Search Report and the Written Opinion of the International Searching Authority", PCT/US2007/022335, (Feb. 18, 2008).
CNET news.com, "Reinventing the Scroll Wheel", Photo 1, http://news.com/2300-1041_3-6107951-1.html?tag=ne.gall.pg, (Aug. 22, 2006),2 pages.
CNET news.com, "Reinventing the Scroll Wheel", Photo 2, http://news.com/2300-1041_3-6107951-2.html?tag=ne.gall.pg, (Aug. 22, 2006),2 pages.
CNET news.com, "Reinventing the Scroll Wheel", Photo 3, http://news.com/2300-1041_3-6107951-3.html?tag=ne.gall.pg, (Aug. 22, 2006),2 pages.
CNET news.com, "Reinventing the Scroll Wheel", Photo 4, http://news.com/2300-1041_3-6107951-4.html?tag=ne.gall.pg, (Aug. 22, 2006),2 pages.
CNET news.com, "Reinventing the Scroll Wheel", Photo 5, http://news.com/2300-1041_3-6107951-5.html?tag=ne.gall.pg, (Aug. 22, 2006),2 pages.
CNET news.com, "Reinventing the Scroll Wheel", Photo 6, http://news.com/2300-1041_3-6107951-6.html?tag=ne.gall.pg, (Aug. 22, 2006),2 pages.
CNET news.com, "Reinventing the Scroll Wheel", Photo 7, http://news.com/2300-1041_3-6107951-7.html?tag=ne.gall.pg, (Aug. 22, 2006),2 pages.
CNET news.com, "Reinventing the Scroll Wheel", Photo 8, http://news.com/2300-1041_3-6107951-8.html?tag=ne.gall.pg, (Aug. 22, 2006),2 pages.
Kennedy, "Methods and Apparatuses for Configuration Automation", U.S. Appl. No. 10/805,144, 59 pages.
Roos, Gina "Agilent's new proximity sensor beats the fumble-fingered competition hands down . . . literally", eeProductCenter, URL:http://www.eeproductcenter.com/showArticle.jhtml?articleID_46200544, (Sep. 1, 2004),3 pages.
Universal Remote Control, Inc., "MX-950 (The Aurora)", www.unversalremote.com, (2005).
Universal Remote Control, Inc., "All Complete Control Remotes Now Use Narrow Band RF", http://www.universalremote.com/corporate/press_release.php?press=13, (2008).
Universal Remote Control, Inc., "Operating System with the Aurora MX-950", MX-950 Owners Manual, (2005).
Non Final Office Action mailed Mar. 22, 2010; U.S. Appl. No. 11/636,251.
Apple Inc., Non Final Office Action mailed Mar. 6, 2010; U.S. Appl. No. 11/620,702.
Apple Inc., Final Office Action mailed Nov. 19, 2009; U.S. Appl. No. 11/620,702.
Apple Inc., PCT Search Report and Written Opinion mailed Jun. 3, 2008, PCT Appln. No. PCT/US2007/026164.
"Apple Inc.", International Preliminary Report on Patentability mailed May 28, 2009; PCT Applicaiotn No. PCT/US2007/023124.
"Apple Inc.", International Preliminary Report on Patentability mailed May 7, 2009; PCT Application No. PCT/US2007/022335.
"Apple Inc.", International Preliminary Report on Patentability mailed Jul. 16, 2009; PCT Application No. PCT/US2007/026164.
"Apple Inc.", International Preliminary Report on Patentability mailed Jul. 16, 2009; PCT Application No. PCT/US2007/026141.
"Proximity Sensor Demo Kit User Guide, Version 0.62—Preliminary", Integration Associates, Inc.; 2004, 17 pages.
Apple Inc., International Preliminary Report on Patentability mailed Jul. 16, 2009; PCT Application No. PCT/US2007/026130.
Apple Inc., "PCT Search Report and Written Opinion mailed Jul. 3, 2008", PCT/US2007/023124, 14 pages.
PCT Search Report mailed Aug. 21, 2008; PCT/US2007/026130.
Apple Inc., Non Final Office Action dated May 24, 2010; U.S. Appl. No. 11/650,014.
Apple Inc., Final Rejection mailed Nov. 15, 2010; U.S. Appl. No. 11/650,014.
Apple Inc., Non Final Rejection mailed Nov. 15, 2010; U.S. Appl. No. 11/770,614.
Apple Inc., Non Final Office Action dated Sep. 29, 2009; U.S. Appl. No. 11/638,251.
Supplemental European Search Report mailed Apr. 21, 2011 for EP Appln No. 07863192.6.

* cited by examiner

INTEGRATED INFRARED RECEIVER AND EMITTER FOR MULTIPLE FUNCTIONALITIES

CROSS-REFERENCE TO RELATED APPLICATION

This application is a utility application of Provisional U.S. patent application Ser. No. 60/906,124, filed Mar. 9, 2007.

FIELD OF THE INVENTION

This invention relates to the filed of sensors and emitters, such as, for example, infrared sensors and emitters.

BACKGROUND OF THE INVENTION

Electronic devices such as computers, televisions, portable media players, telephones, cell phones, and other portable devices are becoming increasingly common. These devices grow more complex over time, incorporating many features including, for example, automatic dimming or control of display backlights, automatic deactivation or control of user input sensors, video player capabilities, MP3 player capabilities, other audio player capabilities, web browsing capabilities, remote control receiver and/or reception capabilities, infrared (IR) data association transmission and reception capabilities, capabilities of personal digital assistants (PDAs), and the like.

Some of these electronic devices may include multiple sensors which are used to detect the environment or context associated with these portable devices, to detect remote control (RC) signals, or to detect data communication signals such as infrared light (IR) data association (DA) signals (IRDA signals). Moreover, some of these electronic devices may include multiple emitters or transmitters, which are used to emit or transmit signals such as a proximity signal for detecting proximity, an RC signal, or an IRDA signal.

For example, U.S. patent application publication no. 92005/0219228 describes a device which includes many sensors, including a proximity sensor and a light sensor. The outputs from the sensors are processed to determine a device context. The light sensor detects ambient light levels and the proximity sensor detects a proximity to an object, such as a user's ear or face. In this case, there are two separate sensors which require two openings in the housing of the device. This is shown in FIG. 1, which shows a device 10. The device 10 includes a proximity sensor 12 mounted on a surface of the device 10 and an ambient light sensor 14 also mounted on the surface of the device 10. Each of these sensors is distinct from the other, and separate openings in the surface are needed for each sensor.

SUMMARY OF THE DESCRIPTION

The various apparatus and methods described herein relate to an integrated sensor and emitter device having one or more sensors (e.g., a photodiode sensor able to detect visible and infrared (IR) light) and/or IR light emitters for sensing and emitting IR signals. At least certain embodiments of the present inventions include a device to sense proximity, to sense IR data signals, and to sense light, using an emitter of an IR proximity signal, and a sensor. The sensor may be configured to detect the IR proximity signal from the emitter when the apparatus is sensing proximity, to detect IR data signals when the apparatus is detecting IR data, and to detect ambient light when the apparatus sensing light. The IR data signals may include IR remote control (RC) and/or IRDA signals. The signals may be detected simultaneously and/or may be in different frequency bands. According to some embodiments of the inventions, in addition to the IR proximity signal, such an emitter may also emit an IR data signal, such as IR RC and/or IRDA signals. Any or all of these signals may be emitted simultaneously and/or may be in different frequency bands. An integrated device with an emitter is configured to emit an IR proximity signal as well as an IR data signal may have a sensor configured to only sense a proximity signal (e.g., and optionally an IR data signal and/or an ambient light signal).

Such an integrated device may further include a filter coupled to the emitter and/or to the sensor, configured to filter out or pass the detected signals, such as using multiple frequency division multiplexing filters (e.g., according to different frequency bands); or using a single time division multiplexing filter, as described herein. The single time division multiplexing filter may include a programmable filter coupled to the sensor, a programmable demodulator/amplitude detector coupled to the programmable filter, and timing sequenced controller coupled to the programmable demodulator/amplitude detector, and a microcontroller coupled to the timing sequenced controller. Alternatively, frequency division multiplexing filters may be used that include a band pass filter coupled to the sensor and configured to pass the detected IR proximity signal, a band pass filter coupled to the sensor and configured to pass the detected IR data signals (e.g., filter the detected IRRC signal when the apparatus is sensing IRRC signals, and/or filter the detected IRDA signal when the apparatus is sensing IRDA signals), and a low pass filter coupled to the sensor and configured to pass the detected ambient light.

Such an integrated device may also further include a processor coupled to the filter(s), configured to process the filtered signals, such as to demodulate data carried or modulated with or onto IR modulation signals. The processor may be one or more processors configured to process the passed IR proximity signal when the apparatus is sensing proximity, process the passed IR data signals when the apparatus is sensing IR data (e.g., process the filtered IRRC signal when the apparatus is sensing IRRC signals, and/or process the filtered IRDA signal when the apparatus is sensing IRDA signals), and process the passed ambient light when the apparatus is sensing ambient light. A microcontroller may be coupled between a host controller and the processor to communicate between the processors and a host controller. The microcontroller may also be coupled to the emitter to control emitting of the IR proximity signal and of the IR data signal.

According to embodiments, a non-IR transmissive fence may be disposed between the emitter and the sensor to remove IR radiation emitted by the emitter from reaching the sensor. In cases where there is a covering over the emitter and detector, the fence may be disposed between the emitter and the sensor to prohibit electromagnetic radiation from the emitter that is refracted by the covering from entering the sensor.

At least certain embodiments of the present inventions include a single integrated circuit (IC) chip to perform functions of detecting, filtering, processing, de-multiplexing, demodulating, modulating, and emitting IR signals described above for apparatus.

At least certain embodiments of the present inventions include a method of operating an integrated sensor and emitter device to sense proximity, to sense infrared (IR) data signals, and to sense ambient light, by emitting an IR proximity signal from an emitter; detecting the IR proximity signal from the emitter with a sensor when the integrated sensor and emitter device is sensing proximity; detecting IR data signals with a sensor when the integrated sensor and emitter device is detecting IR data; and detecting ambient light with a sensor when the integrated sensor and emitter device is sensing ambient light.

At least certain embodiments of the present inventions also include a machine readable media containing executable program instructions which when executed cause a method of operating a data processing system as described above.

Methods and executable program instructions for detecting, filtering, processing, de-multiplexing, demodulating, modulating, and emitting visible and/or IR signals may include those described above being performed by apparatus.

At least certain embodiments of the present inventions also include an apparatus or device to sense proximity, to sense infrared (IR) data signals, and to sense ambient light, where the apparatus includes a data processor, a memory electronically coupled to the data processor, an emitter of an IR proximity signal electronically coupled to the data processor, and three sensors. The first sensor may be electronically coupled to the data processor and configured to detect the IR proximity signal from the emitter when the apparatus is sensing proximity. The second sensor may be electronically coupled to the data processor and configured to detect IR data signals when the apparatus is detecting IR data. The third sensor may be electronically coupled to the data processor and configured to detect ambient light when the apparatus is sensing ambient light.

Other apparatuses, data processing systems, methods and machine readable media are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
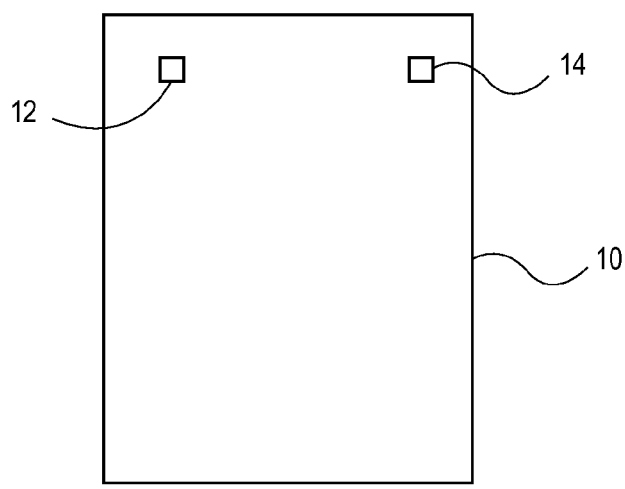
FIG. 1 shows an example of a prior art device which includes two separate sensors.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a through understanding of various embodiments of the present invention. However, in certain instances, well-known or conventional details are not described in order to provide a concise discussion of embodiments of the present inventions.

Some portions of the detailed descriptions which follow are presented in terms of algorithms which include operations on data stored within a computer memory. An algorithm is generally a self-consistent sequence of operations leading to a desired result. The operations typically require or involve physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, can refer to the action and processes of a data processing system, or similar electronic device, that manipulates and transforms data represented as physical (electronic) quantities within the system's registers and memories into other data similarly represented as physical quantities within the system's memories or registers or other such information storage, transmission or display devices.

The present invention can relate to an apparatus for performing one or more of the operations described herein. This apparatus may be specially constructed for the required purposes, or it may comprise a general purpose computer selectively activated or reconfigured by a computer program stored in the computer. Such a computer program may be stored in a machine (e.g. computer) readable storage medium, such as, but is not limited to, any type of disk including floppy disks, optical disks, CD-ROMs, and magnetic-optical disks, read-only memories (ROMs), random access memories (RAMs), erasable programmable ROMs (EPROMs), electrically erasable programmable ROMs (EEPROMs), magnetic or optical cards, or any type of media suitable for storing electronic instructions, and each coupled to a bus.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

At least certain embodiments of the present inventions include an integrated sensor and emitter device having one or more light sensors (e.g., a photodiode sensor able to detect visible and infrared (IR) light) and/or IR light emitters for sensing and emitting IR signals. At least certain embodiments of the present inventions include a device to sense proximity, to sense IR data signals, and to sense light, using an emitter of an IR proximity signal, and a sensor. The sensor may be configured to detect the IR proximity signal from the emitter when the apparatus is sensing proximity, to detect IR data signals when the apparatus is detecting IR data, and to detect ambient light (e.g., visible and IR ambient light) when the apparatus sensing light.

At least certain embodiments of the inventions may be part of a digital media player, such as a portable music and/or video media player, which may include a media processing system to present the media, a storage device to store the media and may further include a radio frequency (RF) transceiver (e.g., an RF transceiver for a cellular telephone) coupled with an antenna system and the media processing system. In certain embodiments, media stored on a remote storage device may be transmitted to the media player through the RF transceiver. The media may be, for example, one or more of music or other audio, still pictures, or motion pictures.

The portable media player may include a media selection device, such as a click wheel input device on an iPod® or iPod Nano® media player from Apple Computer, Inc. of Cupertino, Calif., a touch screen input device, pushbutton device, movable pointing input device or other input device. The media selection device may be used to select the media stored on the storage device and/or the remote storage device. The portable media player may, in at least certain embodiments, include a display device which is coupled to the media processing system to display titles or other indicators of media being selected through the input device and being presented, either through a speaker or earphone(s), or on the display device, or on both display device and a speaker or earphone(s). Examples of a portable media player are described in published U.S. patent application numbers 92003/0095096 and 92004/0224638, both of which are incorporated herein by reference.

Embodiments of the inventions described herein may be part of other types of data processing systems, such as, for example, entertainment systems or personal digital assistants (PDAs), or general purpose computer systems, or special purpose computer systems, or an embedded device within another device, or cellular telephones which do not include media players, or devices which combine aspects or functions of these devices (e.g., a media player, such as an iPod®, combined with a PDA, an entertainment system, and a cellular telephone in one portable device).

Figure 2:
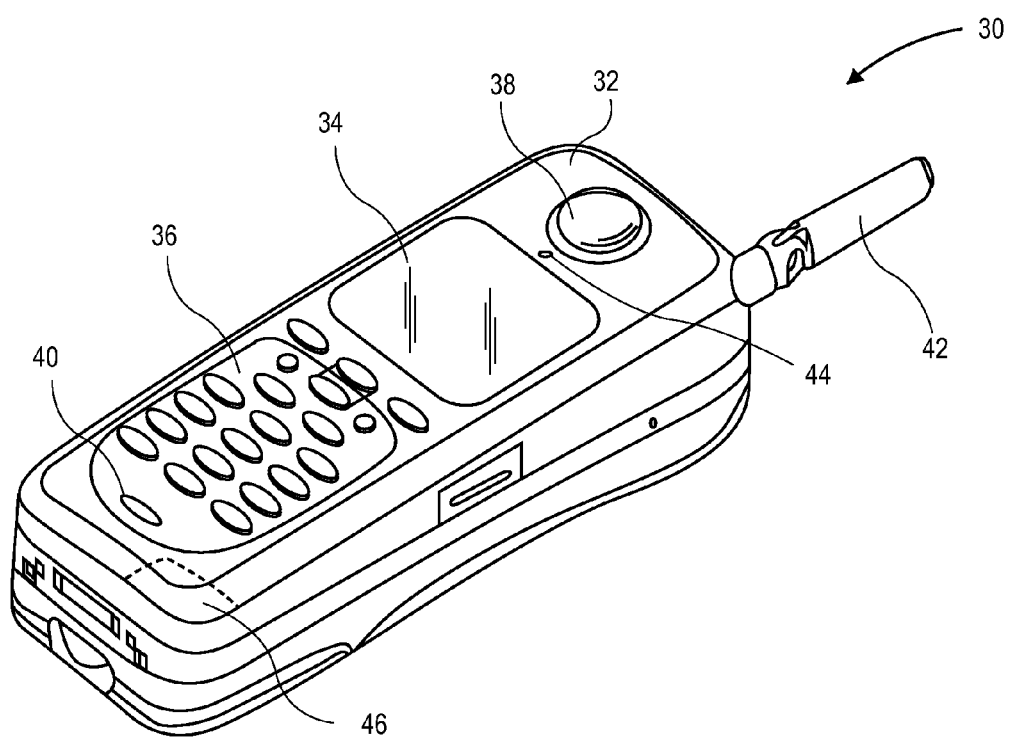
FIG. 2 is a perspective view of a portable device in accordance with one embodiment of the present invention.

FIG. 2 illustrates a portable device 30 according to one embodiment of the invention. FIG. 2 shows a wireless device in a telephone configuration having a "candy-bar" style. In FIG. 2, the wireless device 30 may include a housing 32, a display device 34, an input device 36 which may be an alphanumeric keypad, a speaker 38, a microphone 40 and an antenna 42. The wireless device 30 also may include a proximity sensor 44 and an accelerometer 46. It will be appreciated that the embodiment of FIG. 2 may use more or fewer sensors and may have a different form factor from the form factor shown in FIG. 2.

The display device 34 is shown positioned at an upper portion of the housing 32, and the input device 36 is shown positioned at a lower portion of the housing 32. The antenna 42 is shown extending from the housing 32 at an upper portion of the housing 32. The speaker 38 is also shown at an upper portion of the housing 32 above the display device 34. The microphone 40 is shown at a lower portion of the housing 32, below the input device 36. It will be appreciated that the speaker 38 and microphone 40 can be positioned at any location on the housing, but are typically positioned in accordance with a user's ear and mouth, respectively. The proximity sensor 44 is shown at or near the speaker 38 and at least partially within the housing 32. The accelerometer 46 is shown at a lower portion of the housing 32 and within the housing 32. It will be appreciated that the particular locations of the above-described features may vary in alternative embodiments.

The display device 34 may be, for example, a liquid crystal display (LCD) which does not include the ability to accept inputs or a touch input screen which also includes an LCD. The input device 36 may include, for example, buttons, switches, dials, sliders, keys or keypad, navigation pad, touch pad, touch screen, and the like.

Any well-known speaker, microphone and antenna can be used for speaker 38, microphone 40 and antenna 42, respectively.

Figure 7A:
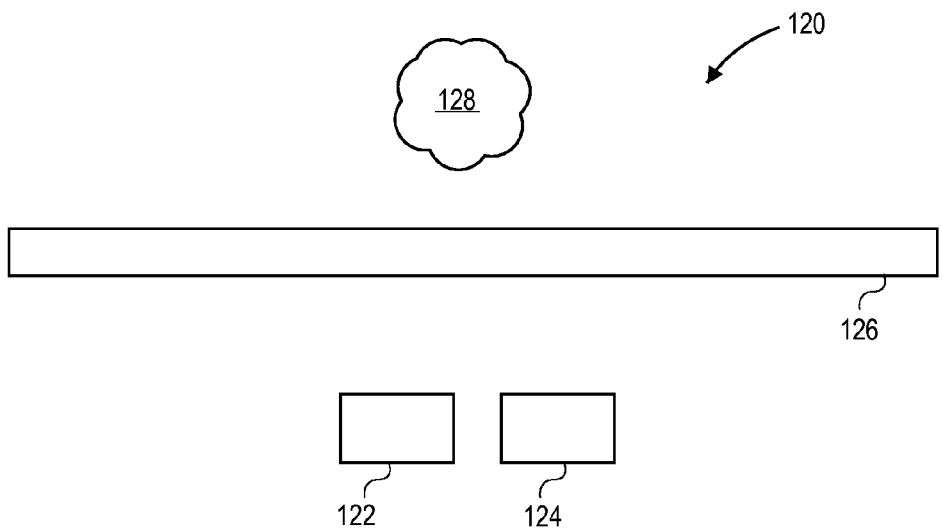
FIG. 7A is a schematic side view of a proximity sensor in accordance with one embodiment of the present invention.

The proximity sensor 44 may detect location (e.g. at least one of X, Y, Z), direction of motion, speed, etc. of objects relative to the wireless device 30. A location of an object relative to the wireless device can be represented as a distance in at least certain embodiments. The proximity sensor may generate location or movement data or both, which may be used to determine the location of objects relative to the portable device 30 and/or proximity sensor 44. An example of a proximity sensor is shown in FIG. 7A.

In addition, a processing device (not shown) is coupled to the proximity sensor(s) 44. The processing device may be used to determine the location of objects relative to the portable device 30 or proximity sensor 44 or both based on the location and/or movement data provided by the proximity sensor 44. The proximity sensor may continuously or periodically monitor the object location. The proximity sensor may also be able to determine the type of object it is detecting.

Additional information about proximity sensors can be found in U.S. patent application Ser. No. 11/241,839, titled "PROXIMITY DETECTOR IN HANDHELD DEVICE," and U.S. patent application Ser. No. 11/240,788, titled "PROXIMITY DETECTOR IN HANDHELD DEVICE;" U.S. patent application Ser. No. 11/165,958, titled "METHODS AND APPARATUS FOR REMOTELY DETECTING PRESENCE," filed Jun. 23, 2005; and U.S. Pat. No. 6,583,676, titled "PROXIMITY/TOUCH DETECTOR AND CALIBRATION CIRCUIT," issued Jun. 24, 2003, all of which are incorporated herein by reference in their entirety.

According to one embodiment, the accelerometer 46 is able to detect a movement including an acceleration or de-acceleration of the wireless device. The accelerometer 46 may generate movement data for multiple dimensions, which may be used to determine a direction of movement of the wireless device. For example, the accelerometer 46 may generate X, Y and Z axis acceleration information when the accelerometer 46 detects that the portable device is moved. In one embodiment, the accelerometer 46 may be implemented as described in U.S. Pat. No. 6,520,013, which is incorporated herein by reference in its entirety. Alternatively, the accelerometer 46 may be a KGFOL accelerometer from Kionix or an ADXL311 accelerometer from Analog Devices or other accelerometers which are known in the art.

In addition, a processing device (not shown) is coupled to the accelerometer(s) 46. The processing device may be used to calculate a direction of movement, also referred to as a movement vector of the wireless device 30. The movement vector may be determined according to one or more predetermined formulas based on the movement data (e.g., movement in X, Y and Z) provided by accelerometer 46. The processing device may be integrated with the accelerometer 46 or integrated with other components, such as, for example, a chipset of a microprocessor, of the portable device.

The accelerometer 46 may continuously or periodically monitor the movement of the portable device. As a result, an orientation of the portable device prior to the movement and after the movement may be determined based on the movement data provided by the accelerometer attached to the portable device.

Additional information about accelerometers can be found in co-pending U.S. patent application Ser. No. 10/986,730, filed Nov. 12, 2004, which is hereby incorporated herein by reference in its entirety.

The data acquired from the proximity sensor 44 and the accelerometer 46 can be combined together, or used alone, to gather information about the user's activities. The data from the proximity sensor 44, the accelerometer 46 or both can be used, for example, to activate/deactivate a display backlight, initiate commands, make selections, control scrolling or other movement in a display, control input device settings, or to make other changes to one or more settings of the device.

Figure 3:
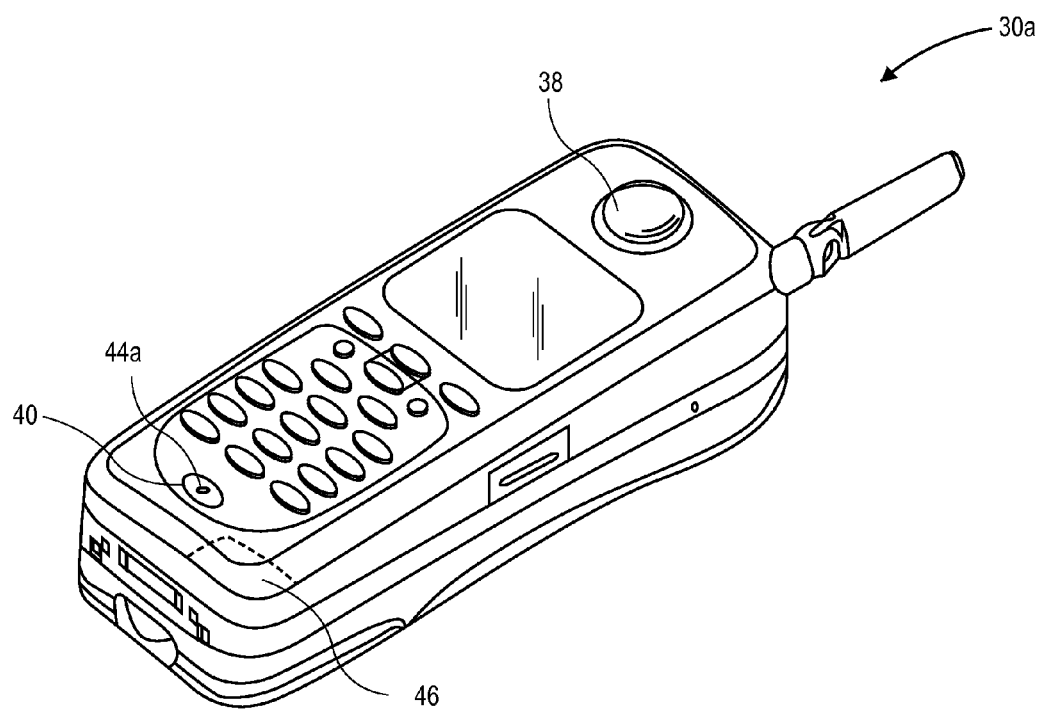
FIG. 3 is a perspective view of a portable device in accordance with one embodiment of the present invention.

FIG. 3 shows an alternative portable device 30a, which is similar to the portable device 30 illustrated in FIG. 2. The portable device 30a shown in FIG. 3 can differ from the portable device 30 shown in FIG. 2 in that the proximity sensor 44a (FIG. 3) is located at or near the microphone 40.

Figure 4:
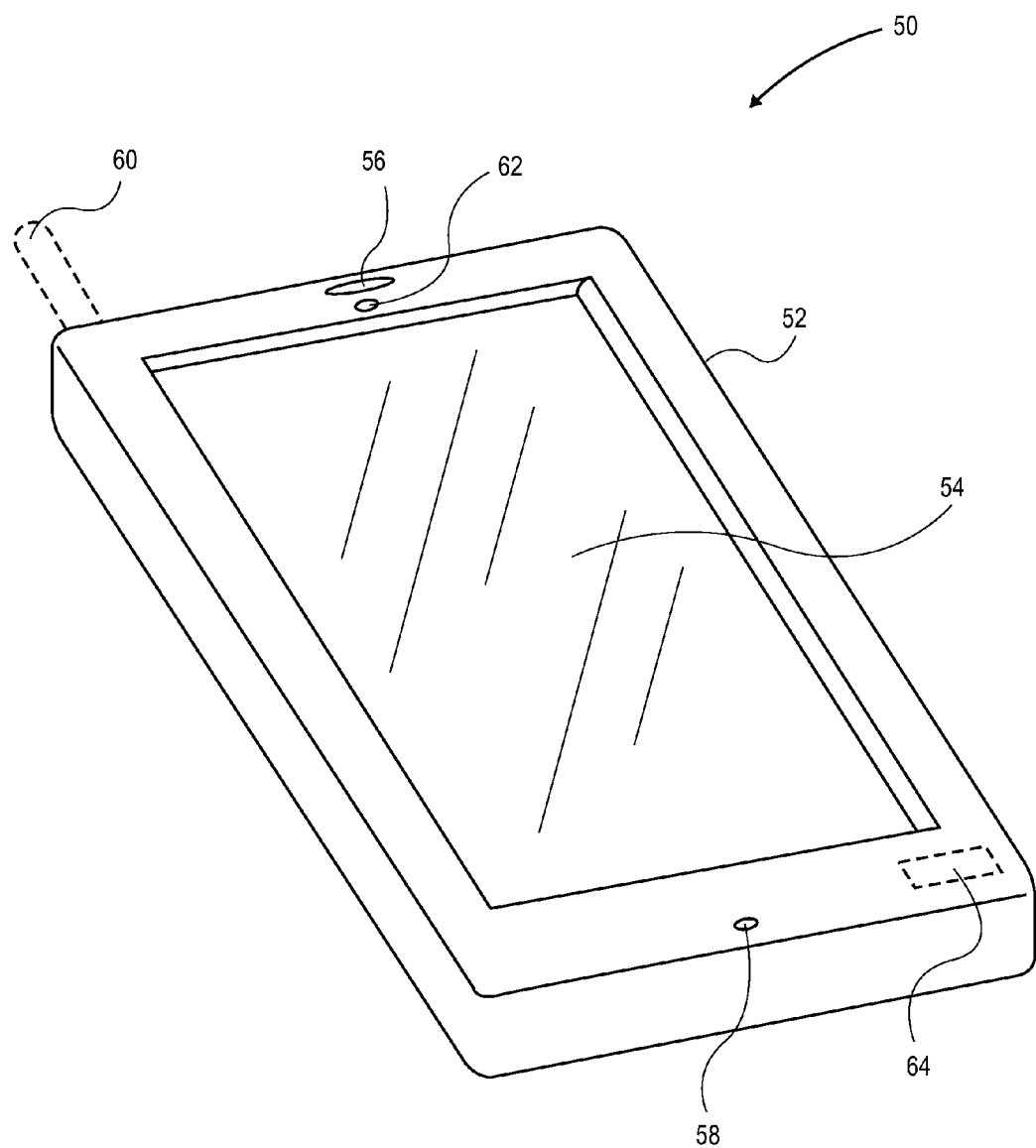
FIG. 4 is a perspective view of a portable device in accordance with one embodiment of the present invention.

FIG. 4 shows a portable device 50 in accordance with one embodiment of the invention. The portable device 50 may include a housing 52, a display/input device 54, a speaker 56, a microphone 58 and an optional antenna 60 (which may be visible on the exterior of the housing or may be concealed within the housing). The portable device 50 also may include a proximity sensor 62 and an accelerometer 64. The portable device 50 may be a cellular telephone or a device which is an integrated PDA and a cellular telephone or a device which is an integrated media player and a cellular telephone or a device which is both an entertainment system (e.g. for playing games) and a cellular telephone, or the portable device 50 may be other types of devices described herein. In one particular embodiment, the portable device 50 may include a cellular telephone and a media player and a PDA, all contained within the housing 52. The portable device 50 may have a form factor which is small enough that it fits within the hand of a normal adult and is light enough that it can be carried in one hand by an adult. It will be appreciated that the term "portable" means the device can be easily held in an adult user's hands (one or both); for example, a laptop computer and an iPod are portable devices.

In one embodiment, the display/input device 54 may include a multi-point touch input screen in addition to being a display, such as an LCD. In one embodiment, the multi-point touch screen is a capacitive sensing medium configured to detect multiple touches (e.g., blobs on the display from a user's face or multiple fingers concurrently touching or nearly touching the display) or near touches (e.g., blobs on the display) that occur at the same time and at distinct locations in the plane of the touch panel and to produce distinct signals representative of the location of the touches on the plane of the touch panel for each of the multiple touches. Additional information about multi-point input touch screens can be found in co-pending U.S. patent application Ser. No. 10/840,862, filed May 6, 2004 (see published U.S. patent application 20060097991), which is incorporated herein by reference in its entirety. A multi-point input touch screen may also be referred to as a multi-touch input panel.

A processing device (not shown) may be coupled to the display/input device 54. The processing device may be used to calculate touches on the touch panel. The display/input device 54 can use the detected touch (e.g., blob or blobs from a user's face) data to, for example, identify the location of certain objects and to also identify the type of object touching (or nearly touching) the display/input device 54.

The data acquired from the proximity sensor 62 and the display/input device 54 can be combined to gather information about the user's activities as described herein. The data from the proximity sensor 62 and the display/input device 54 can be used to change one or more settings of the portable device 50, such as, for example, change an illumination setting of the display/input device 54.

In one embodiment, as shown in FIG. 4, the display/input device 54 occupies a large portion of one surface (e.g. the top surface) of the housing 52 of the portable device 50. In one embodiment, the display/input device 54 consumes substantially the entire front surface of the portable device 50. In another embodiment, the display/input device 54 consumes, for example, at least 75% of a front surface of the housing 52 of the portable device 50. In alternative embodiments, the portable device 50 may include a display which does not have input capabilities, but the display still occupies a large portion of one surface of the portable device 50. In this case, the portable device 50 may include other types of input devices such as a QWERTY keyboard or other types of keyboard which slide out or swing out from a portion of the portable device 50.

Figure 5A:
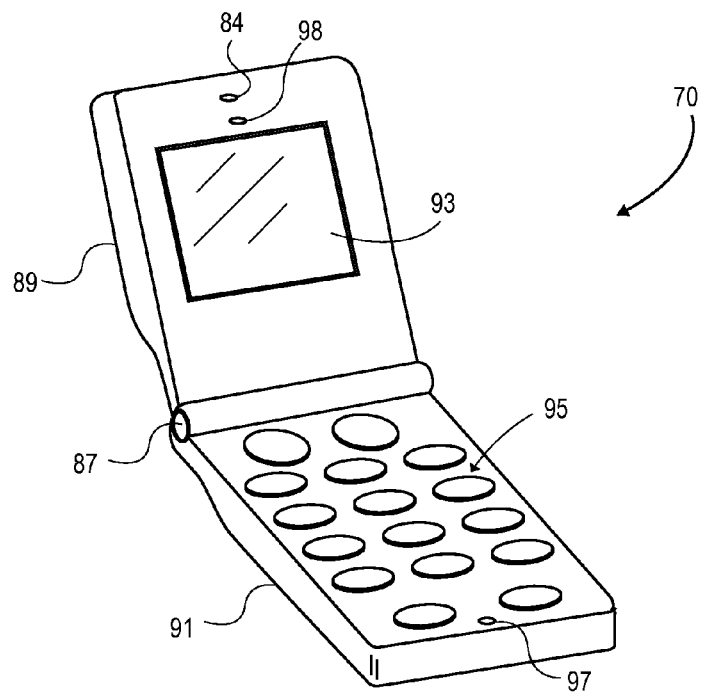
FIG. 5A is a perspective view of a portable device in a first configuration (e.g. in an open configuration) in accordance with one embodiment of the present invention.
Figure 5B:
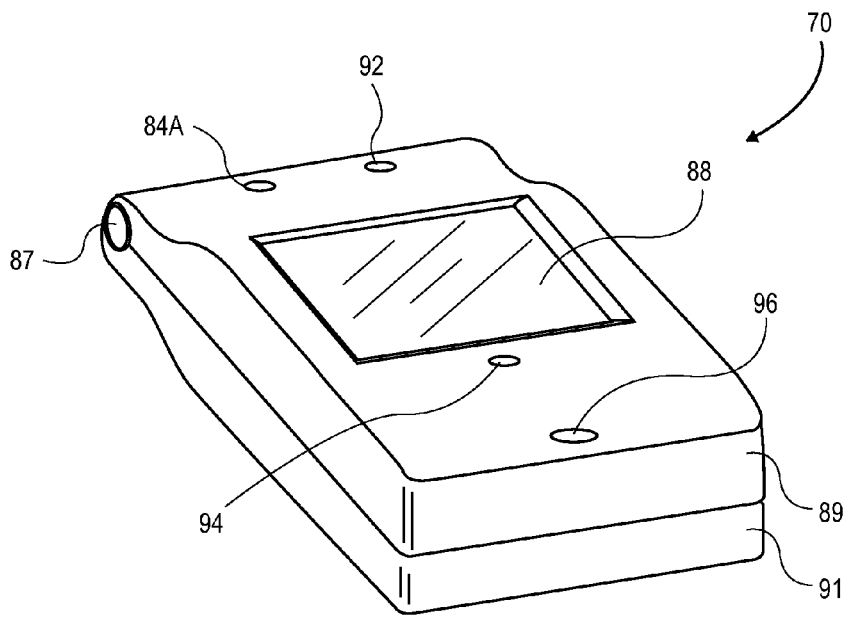
FIG. 5B is a perspective view of the portable device of FIG. 5A in a second configuration (e.g. a closed configuration) in accordance with one embodiment of the present invention.

FIGS. 5A and 5B illustrate a portable device 70 according to one embodiment of the invention. The portable device 70 may be a cellular telephone which includes a hinge 87 that couples a display housing 89 to a keypad housing 91. The hinge 87 allows a user to open and close the cellular telephone so that it can be placed in at least one of two different configurations shown in FIGS. 5A and 5B. In one particular embodiment, the hinge 87 may rotatably couple the display housing to the keypad housing. In particular, a user can open the cellular telephone to place it in the open configuration shown in FIG. 5A and can close the cellular telephone to place it in the closed configuration shown in FIG. 5B. The keypad housing 91 may include a keypad 95 which receives inputs (e.g. telephone number inputs or other alphanumeric inputs) from a user and a microphone 97 which receives voice input from the user. The display housing 89 may include, on its interior surface, a display 93 (e.g. an LCD) and a speaker 98 and a proximity sensor 84; on its exterior surface, the display housing 89 may include a speaker 96, a temperature sensor 94, a display 88 (e.g. another LCD), an ambient light sensor 92, and a proximity sensor 84A. Hence, in this embodiment, the display housing 89 may include a first proximity sensor on its interior surface and a second proximity sensor on its exterior surface. The first proximity sensor may be used to detect a user's head or ear being within a certain distance of the first proximity sensor and to cause an illumination setting of displays 93 and 88 to be changed automatically in response to this detecting (e.g. the illumination for both displays are turned off or otherwise set in a reduced power state). Data from the second proximity sensor, along with data from the ambient light sensor 92 and data from the temperature sensor 94, may be used to detect that the cellular telephone has been placed into the user's pocket.

In at least certain embodiments, the portable device 70 may contain components which provide one or more of the functions of a wireless communication device such as a cellular telephone, a media player, an entertainment system, a PDA, or other types of devices described herein. In one implementation of an embodiment, the portable device 70 may be a cellular telephone integrated with a media player which plays MP3 files, such as MP3 music files.

Figure 6:
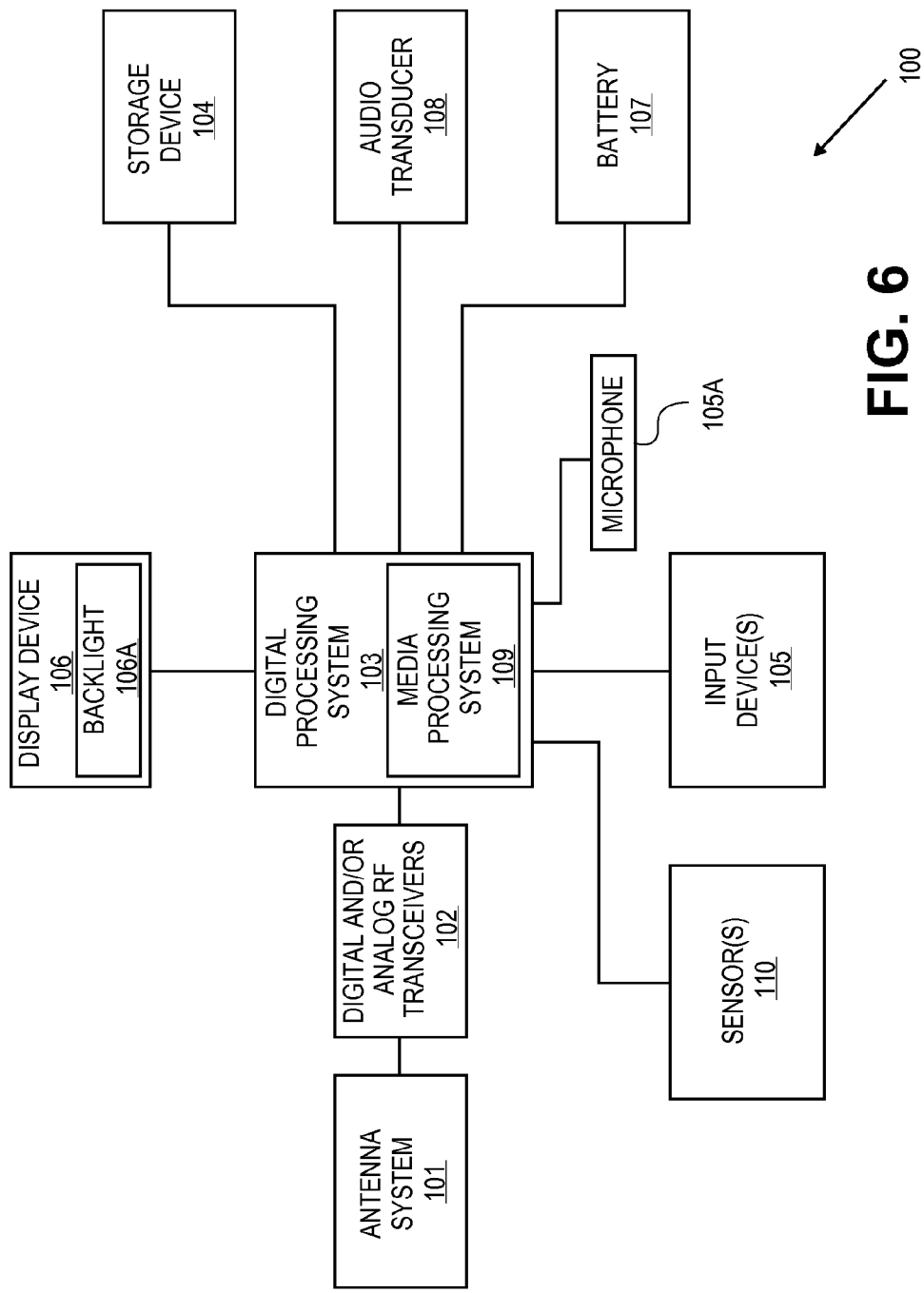
FIG. 6 is a block diagram of a system in which embodiments of the present invention can be implemented.

Each of the devices shown in FIGS. 2, 3, 4, 5A and 5B may be a wireless communication device, such as a cellular telephone, and may include a plurality of components which provide a capability for wireless communication. FIG. 6 shows an embodiment of a wireless device 100 which includes the capability for wireless communication. The wireless device 100 may be included in any one of the devices shown in FIGS. 2, 3, 4, 5A and 5B, although alternative embodiments of those devices of FIGS. 2-5B may include more or fewer components than the wireless device 100.

Wireless device 100 may include an antenna system 101. Wireless device 100 may also include a digital and/or analog radio frequency (RF) transceiver 102, coupled to the antenna system 101, to transmit and/or receive voice, digital data and/or media signals through antenna system 101.

Wireless device 100 may also include a digital processing system 103 to control the digital RF transceiver and to manage the voice, digital data and/or media signals. Digital processing system 103 may be a general purpose processing device, such as a microprocessor or controller for example. Digital processing system 103 may also be a special purpose processing device, such as an ASIC (application specific integrated circuit), FPGA (field-programmable gate array) or DSP (digital signal processor). Digital processing system 103 may also include other devices, as are known in the art, to interface with other components of wireless device 100. For example, digital processing system 103 may include analog-to-digital and digital-to-analog converters to interface with other components of wireless device 100. Digital processing system 103 may include a media processing system 109, which may also include a general purpose or special purpose processing device to manage media, such as files of audio data.

Wireless device 100 may also include a storage device 104, coupled to the digital processing system, to store data and/or operating programs for the wireless device 100. Storage device 104 may be, for example, any type of solid-state or magnetic memory device.

Wireless device 100 may also include one or more input devices 105, coupled to the digital processing system 103, to accept user inputs (e.g., telephone numbers, names, addresses, media selections, etc.) Input device 105 may be, for example, one or more of a keypad, a touchpad, a touch screen, a pointing device in combination with a display device or similar input device.

Wireless device 100 may also include at least one display device 106, coupled to the digital processing system 103, to display information such as messages, telephone call information, contact information, pictures, movies and/or titles or other indicators of media being selected via the input device 105. Display device 106 may be, for example, an LCD display device. In one embodiment, display device 106 and input device 105 may be integrated together in the same device (e.g., a touch screen LCD such as a multi-touch input panel which is integrated with a display device, such as an LCD display device). Examples of a touch input panel and a display integrated together are shown in U.S. published application No. 20060097991. The display device 106 may include a backlight 106a to illuminate the display device 106 under certain circumstances. It will be appreciated that the wireless device 100 may include multiple displays.

Wireless device 100 may also include a battery 107 to supply operating power to components of the system including digital RF transceiver 102, digital processing system 103, storage device 104, input device 105, microphone 105A, audio transducer 108, media processing system 109, sensor(s) 110, and display device 106. Battery 107 may be, for example, a rechargeable or non-rechargeable lithium or nickel metal hydride battery. Wireless device 100 may also include audio transducers 108, which may include one or more speakers, and at least one microphone 105A.

Wireless device 100 may also include one or more sensors 110 coupled to the digital processing system 103. The sensor(s) 110 may include, for example, one or more of a proximity sensor, accelerometer, touch input panel, ambient light sensor, ambient noise sensor, temperature sensor, gyroscope, a hinge detector, a position determination device, an orientation determination device, a motion sensor, a sound sensor, a radio frequency electromagnetic wave sensor, and other types of sensors and combinations thereof. Based on the data acquired by the sensor(s) 110, various responses may be performed automatically by the digital processing system, such as, for example, activating or deactivating the backlight 106a, changing a setting of the input device 105 (e.g. switching between processing or not processing, as an intentional user input, any input data from an input device), and other responses and combinations thereof. In one embodiment, digital RF transceiver 102, digital processing system 103 and/or storage device 104 may include one or more integrated circuits disposed on a printed circuit board (PCB).

Figure 7B:
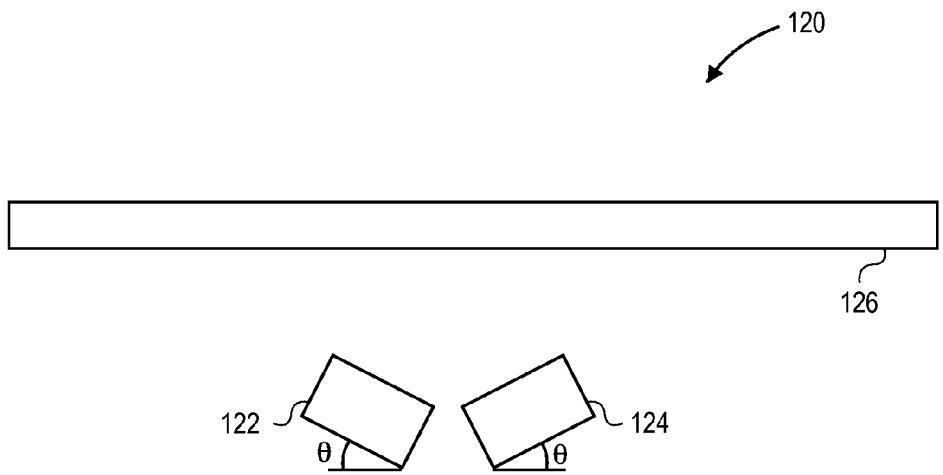
FIG. 7B is a schematic side view of an alternative proximity sensor in accordance with one embodiment of the present invention.

FIGS. 7A and 7B illustrate exemplary proximity sensors in accordance with embodiments of the invention. It will be appreciated that, in alternative embodiments, other types of proximity sensors, such as capacitive sensors or sonar-like sensors, may be used rather than the proximity sensors shown in FIGS. 7A and 7B. In FIG. 7A, the proximity sensor 120 includes an emitter 122, a detector 124, and a window 126. The emitter 122 generates light in the infrared (IR) bands, and may be, for example, a Light Emitting Diode (LED). The detector 124 is configured to detect changes in light intensity and may be, for example, a phototransistor. The window 126 may be formed from translucent or semi-translucent material. In one embodiment, the window 126 is an acoustic mesh, such as, for example, a mesh typically found with a microphone or speaker of the portable device. In other embodiments, the window 126 may be MicroPerf, IR transparent strands wound in a mesh, or a cold mirror.

During operation, the light from the emitter 122 hits an object and scatters when the object is present above the window 126. The light from the emitter may be emitted in square wave pulses which have a known frequency, thereby allowing the detector 124 to distinguish between ambient light and light from emitter 122 which is reflected by an object, such as the user's head or ear or a material in a user's pocket, back to the detector 124. At least a portion of the scattered light is reflected towards the detector 124. The increase in light intensity is detected by the detector 124, and this is interpreted by a processing system (not shown in FIG. 7A) to mean an object is present within a short distance of the detector 124. If no object is present or the object is beyond a certain distance from the detector 124, an insufficient or smaller amount of the emitted light is reflected back towards the detector 124, and this is interpreted by the processing system (not shown in FIG. 7A) to mean that an object is not present or is at a relatively large distance. In each case, the proximity sensor is measuring the intensity of reflected light which is related to the distance between the object which reflects the light and detector 124. In one embodiment, the emitter 122 and detector 124 are disposed within the housing of a portable device, as described above with reference to FIGS. 2-5B.

In FIG. 7B, the emitter 122 and detector 124 of the proximity sensor are angled inward towards one another to improve detection of the reflected light, but the proximity sensor of FIG. 7B otherwise operates in a manner similar to the proximity sensor of FIG. 7A.

A proximity sensor in one embodiment of the inventions includes the ability to both sense proximity and detect electromagnetic radiation, such as light, from a source other than the emitter of the proximity sensor. One implementation of this embodiment may use an emitter of IR light and a detector of IR light to both sense proximity (when detecting IR light from the emitter) and to detect IR light from sources other than the emitter. The use of IR light for both the emitter and the detector of the proximity sensor may be advantageous because IR light is substantially present in most sources of ambient light (such as sunshine, incandescent lamps, LED light sources, candles, and to some extent, even fluorescent lamps). Thus, the detector can detect ambient IR light (which also may be described as "IR ambient light" or "ambient IR light"), which will generally represent, in most environments, ambient light levels at wavelengths other than IR, and use the ambient IR light level to effectively and reasonably accurately represent ambient light levels at wavelengths other than IR.

Figure 7C:
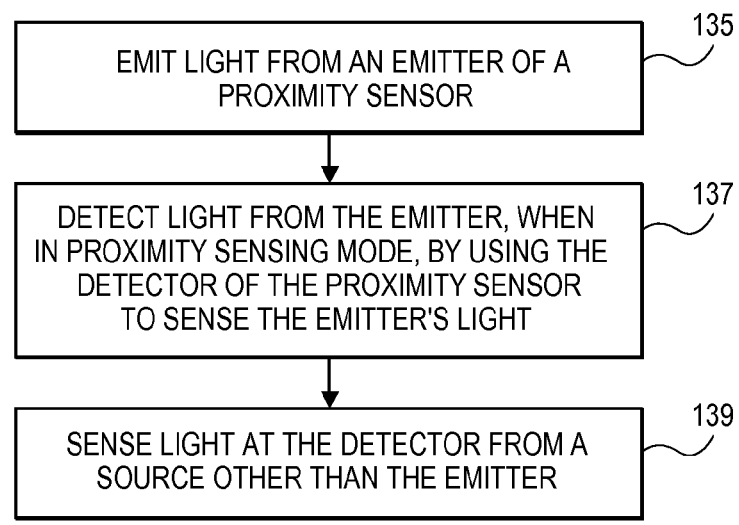
FIG. 7C is a flow chart which shows a method of operating a proximity sensor which is capable of detecting light from a source other than the emitter of the proximity sensor.
Figure 7D:
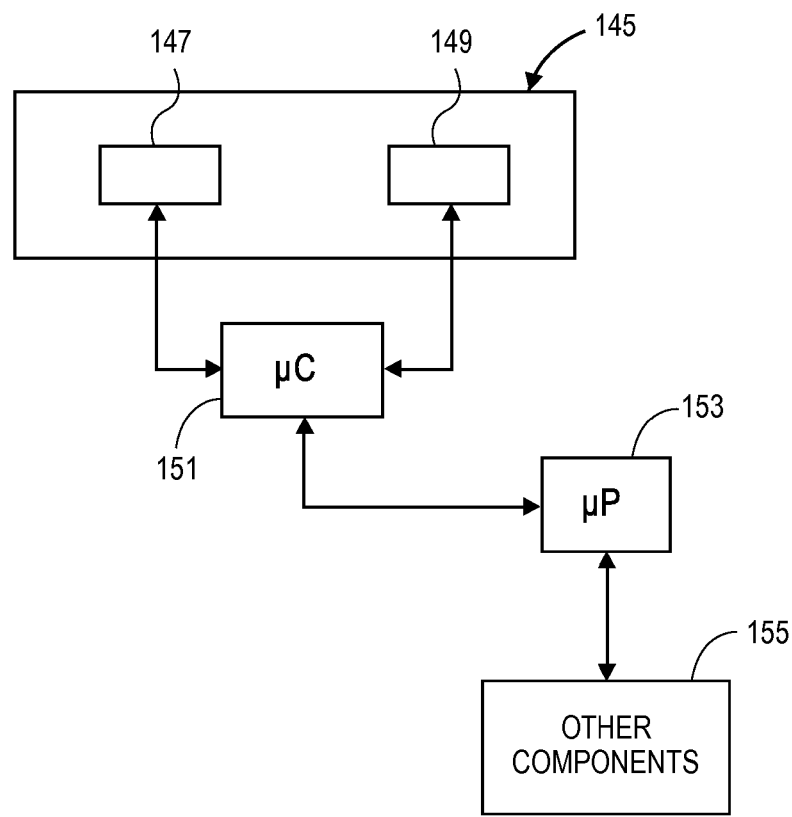
FIG. 7D shows an example of a proximity sensor with associated logic.

A method of operating a proximity sensor which includes the ability to both sense proximity and detect light is shown in FIG. 7C and an example, in block diagram form, of such a proximity sensor is shown in FIG. 7D. The method of FIG. 7C may use the proximity sensor shown in FIG. 7D or other proximity sensors. The method includes operation 135 in which electromagnetic radiation (e.g. IR light) is emitted from the emitter of the proximity sensor. The emitter may emit the radiation in a known, predetermined pattern (e.g. a train of square wave pulses of known, predetermined pulse width and frequency) which allows a detector to distinguish between ambient radiation and radiation from the emitter. In operation 137, the detector of the proximity sensor detects and measures light from the emitter when the detector is operating in proximity sensing mode. A processor coupled to the detector may process the signal from the detector to identify the known predetermined pattern of radiation from the emitter and to measure the amount of radiation from the emitter. In operation 139, the detector is used in a mode to sense radiation (e.g. ambient IR light) from a source other than the emitter; this operation may be implemented in a variety of ways. For example, the emitted light from the emitter may be disabled by a shutter (either a mechanical or electrical shutter) placed over the emitter or the emitter's power source may be turned off (thereby stopping the emission of radiation from the emitter). Alternatively, known signal processing techniques may be used to remove the effect of the emitter's emitted light which is received at the detector in order to extract out the light from sources other than the emitter. These signal processing techniques may be employed in cases where it is not desirable to turn on and off the emitter and where it is not desirable to use a shutter. It will be appreciated that operations 135, 137 and 139 may be performed in a sequence which is different than the sequence shown in FIG. 7C; for example, operation 139 may occur before operations 135 and 137.

FIG. 7D shows an embodiment of a range sensing IR proximity sensor 145 which can include the ability to sense and measure proximity and to detect and measure ambient light levels. The proximity sensor 145 can include an IR emitter 147 (e.g. an IR LED) and an IR detector 149. An optional shutter (e.g. an LCD electronic shutter) may be disposed over the emitter 147. The IR emitter 147 and the IR detector 149 may be coupled to a microcontroller 151 which may control switching between proximity sensing mode and ambient light sensing mode by either closing and opening an optional shutter or by turning on and off the power to the IR emitter 147. The output from the IR detector 149 may be provided from the microcontroller 151 to the microprocessor 153 which determines, from data from the proximity sensor 145, at least one proximity value and determines at least one ambient light level value. In an alternative embodiment, the microprocessor may be coupled to the IR emitter 147 and to the IR detector 149 without an intervening microcontroller, and the microprocessor may perform the functions of the microcontroller (e.g. the microprocessor may control switching between proximity sensing mode and ambient light sensing mode). The microprocessor 153 may be coupled to other components 155, such as input (e.g. keypad) or output (e.g. display) devices or memory devices or other sensors or a wireless transceiver system, etc. For example, the microprocessor 153 may be the main processor of the wireless device 100 shown in FIG. 6. In those embodiments in which a shutter over the IR emitter is not used and IR emissions from the IR emitter 147 are received at the IR detector 149 while the IR detector 149 is measuring ambient light levels, the microprocessor 153 (or the microcontroller 151) may filter out the known predetermined pattern of IR light from the IR emitter 147 in order to extract a signal from the IR detector 149 representing the IR light level from sources other than the IR emitter 147.

According to embodiments, an integrated sensor and emitter (e.g., a device, chip, data processing device, apparatus, method, medium, instructions and/or components thereof) may be used in place of any of the sensors described above for FIGS. 1-7, or below for FIGS. 8 and 13.

Figure 9:
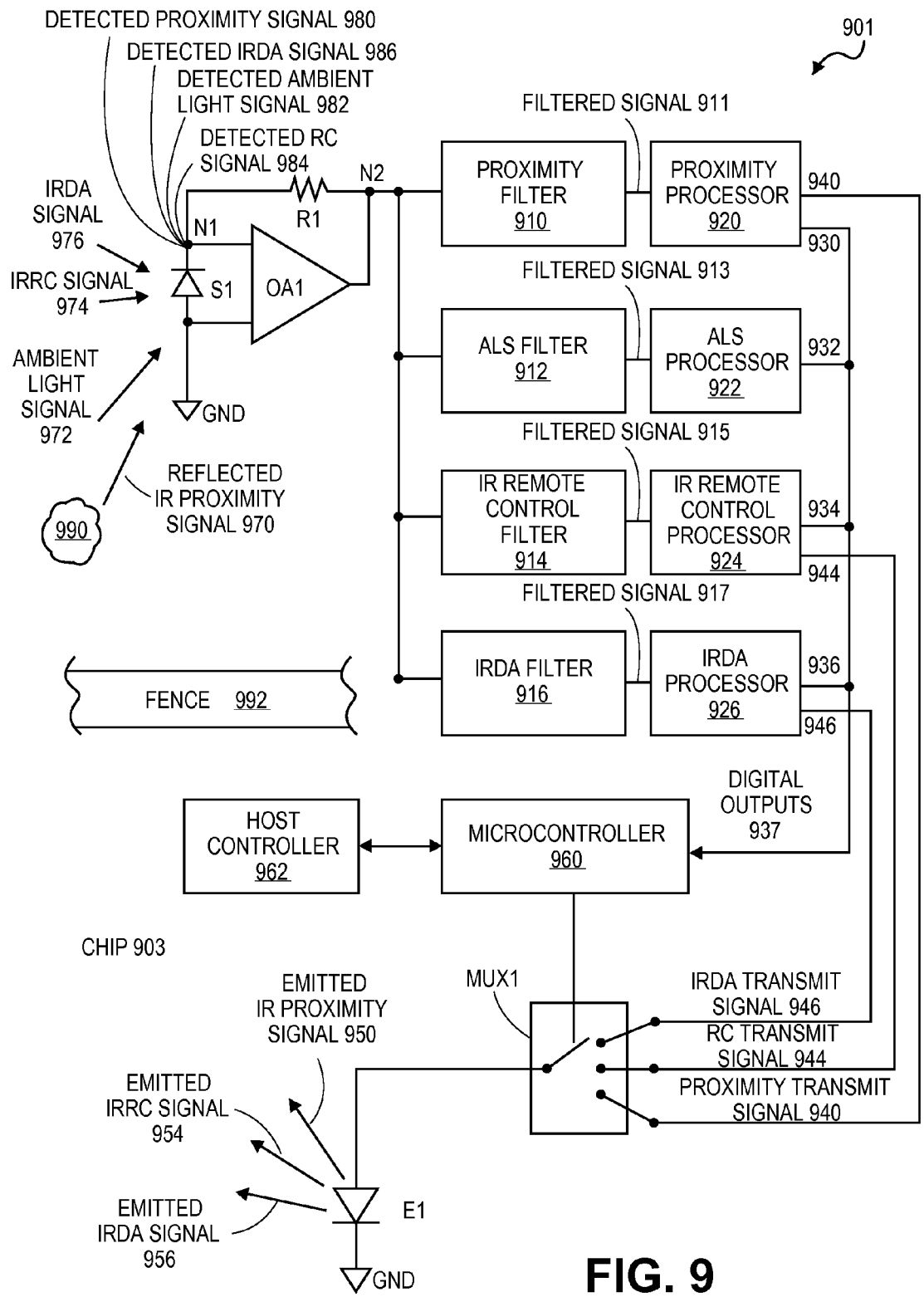
FIG. 9 shows a schematic of an integrated sensor and emitter in accordance with one embodiment of the present invention.

FIG. 9 shows a schematic of an integrated sensor and emitter in accordance with one embodiment of the present invention. FIG. 9 shows integrated sensor and emitter device 901 (e.g., "an integrated device" or "device 901"), such as a sensor and emitter to sense proximity, to sense IR data signals, and to sense light. FIG. 9 shows device 901 including sensor S1 coupled across the inputs of operation amplifier (OA) 1 (e.g., a pre-amp), ground signals (GND), resistor R1, emitter E1, and multiplexers (MUX) 1.

FIG. 9 shows resistor R1 is can be used to provide feedback from OA1 so that OA1 may function as a preamplifier for the signal generated by sensor S1. Thus, signals received at node N1 may be amplified (e.g., with respect to signal level or amplitude) at node N2, but have other frequency and waveform characteristics (e.g., waveform over time) equal at nodes N1 and N2. Moreover, sensor S1 may be a sensor, such as a sensor that is able to convert received and detected visible and IR light (e.g., light signals, photons, modulated data and the like) into an electronic signal at node N1. According to embodiments, sensor S1 may be a photodiode (e.g., a phototransistor) sensor (e.g., a receiver) able to detect visible light (including ambient visible light) and IR light (including ambient IR light). Such light may include ambient light generated by the sun, incandescent light bulbs or sources, and/or fluorescent light bulbs or sources. For example, FIG. 9 shows sensor S1 receiving and detecting IRDA signal 976, IR remote control (RC) signal 974, ambient light signal 972 (e.g., including both visible and IR ambient light), and reflected IR proximity signal 970. Note that remote control (RC) filters, processors, signals, etc. described herein may or may not include resistor (R) capacitor (C) type filters, processors, signals, etc.

Sensor S1 may detect IR proximity signal 970 from the emitter when the device 901 is sensing proximity, detect IR data signals 974 and 976 when device 901 is detecting IR data, and detect ambient light signal 972 when device 901 is sensing light. Signal 970 may be a signal reflected by object 990, such as a reflection of signal 950 by the surface or material of object 990, and received and detected by sensor S1. Signal 972 may be or include visible as well as IR ambient light, and sensor S1 may detect the visible and IR bandwidth or portion (e.g., the visible and IR frequency or bandwidth spectrum) of the ambient light. Optionally, sensor S1 may only detect the IR bandwidth or portion (e.g., the IR frequency or bandwidth spectrum) of the ambient light, such as where sensor S1 is an IR light only sensor and/or has a non-visible light transmissive cover (e.g., does not transmit visible light but may transmit IR light and other frequency light) over it. As noted above for FIG. 7, an ambient light level (e.g., of visible ambient light or non-IR ambient light) may be determined from the IR ambient light detected. In some cases, sensor S1 may detect IR RC signal 974 when device 901 is sensing IRRC signals and detect IRDA signal 976 when device 901 is sensing IRDA signals.

Sensor S1 may convert or light signals 970, 972, 974 and/or 976 into electronic signals. Specifically, sensor S1 may convert signal 970 into detected proximity signal 980, may convert signal 972 into detected ambient light signal 982, may convert signal 974 into detected RC signal 984, and may convert signal 976 into detected IRDA signal 986. Signals 980, 982, 984 and 986 may be received at node N1 and amplified by OA1 to also be received at node N2 (e.g., being amplified signals, such as by having amplified level or amplitude at node N2). Similarly, sensor S1 may receive and detect signal 970, 972, 974 and 976 simultaneously, such as to output or create signal 980, 982, 984 and/or 986 simultaneously.

MUX 1 may select between input signals IRDA signal 946, RC transmit signal 944, and proximity transmit signal 940. Selection by MUX 1 may be controlled by microcontroller 960. Thus, signal 940, 944 and/or 946 may be received at emitter E1. Emitter E1 may be an infrared emitter capable of converting electrical signals received by the emitter into infrared light signals and/or data. For example, FIG. 9 shows emitter E1 emitting (e.g., transmitting) emitted IR proximity signal 950, emitted IR RC signal 954, and emitted IRDA signal 956. For example emitter E1 may emit signal 950 when device 901 is detecting proximity, or emitting a proximity signal. Also, emitter E1 may emit signal 954 and/or 956 when device 901 is emitting IR data signals. Also, emitter E1 may emit signal 954 when device 901 is emitting an IRRC signal and emit IRDA signal 956 when device 901 is emitting an IRDA signal. Specifically, emitter E1 may be a light source able to emit IR light, such as an IR LED (e.g., photodiode or phototransistor).

FIG. 9 shows sensor S1, which can be coupled to proximity filter 910, ambient light sensor (ALS) filter 912, IR remote control filter 914, and IRDA filter 916 (such as by being coupled through node N2). Filters 910, 912, 914 and 916 may filter the signal received by sensor S1, such as by passing different frequencies, frequency bandwidths, of signals output by sensor S1, signal 980, signal 984 and/or signal 986.

For example, proximity filter 910 may be a band pass filter to pass signals (e.g., as passed or filtered proximity signal 911) having a frequency of between 100 kHz and 300 kHz or a frequency of between 70 kHz and 350 kHz to proximity processor 920. Also, ALS filter 912 may be a low pass filter, such as a filter to pass signals (e.g., as passed or filtered ALS signal 913) having a frequency less than 100 Hz to ALS processor 922. Also, IR remote control filter 914 may be a band pass filter, such as a filter to pass signals (e.g., as passed or filtered RC signal 915) having a frequency of between 30 kHz and 50 kHz to IR remote control processor 924. Also, IRDA filter 916 may be a pass band filter or a center frequency filter, such as to pass signals (e.g., as passed or filtered IRDA signal 917) having a frequency as known in the art for an IRDA signal to IRDA processor 926. For example, filter 916 may be a pass band filter or a center frequency filter, such as to pass signals having a frequency of between 500 kHz and 10 MHz, or a filter having a center frequency at 1 MHz, to IRDA processor 926. In addition, emitted signals 950, 954 and/or 956 may have frequencies or be in frequency bands similar to those described above for signals 911, 915 and/or 917, respectively. Also, it is considered that signals 950, 954, 956, 911, 915 and/or 917 may be one or more signals in different "channels" of the bands, such as by being at one of various different peak frequencies (e.g., modulated by different frequency carriers) within the band.

Figure 11:
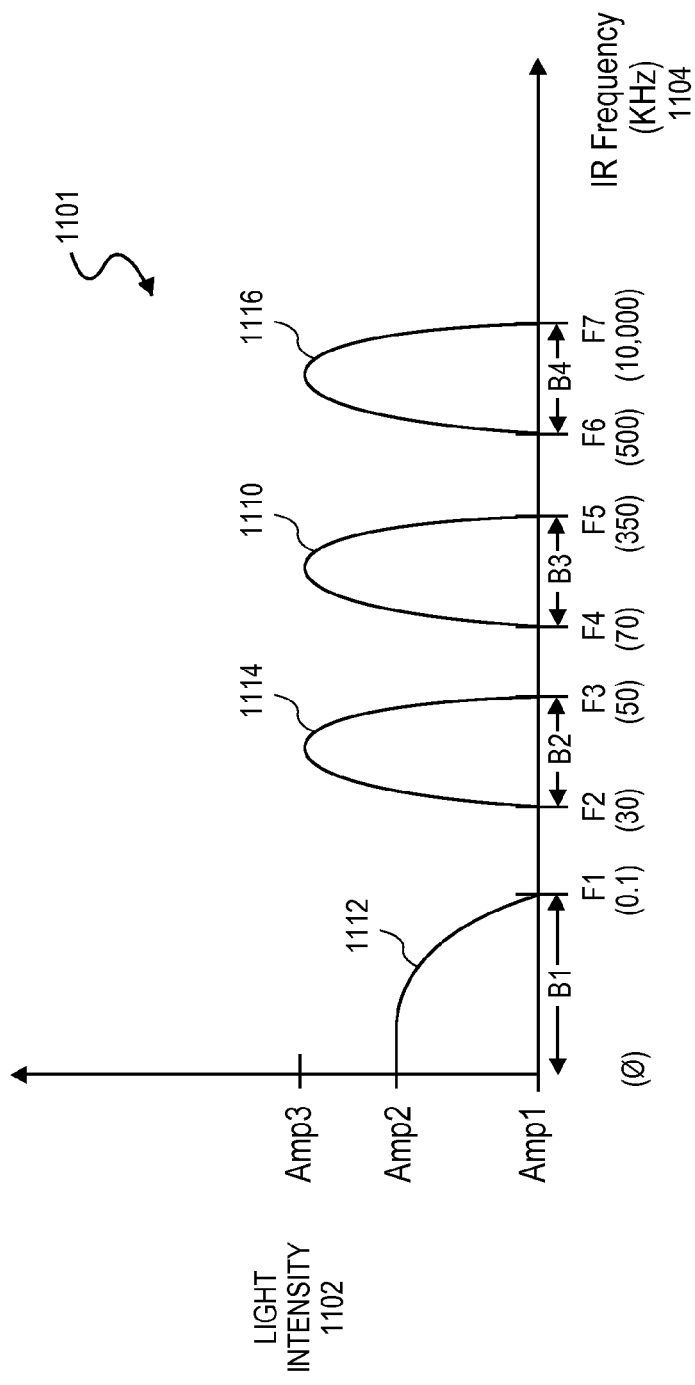
FIG. 11 is a graph showing light intensity versus frequency for light signals in accordance with one embodiment of the present invention.

FIG. 11 is a graph showing light intensity versus frequency 1101 for light signals in accordance with one embodiment of the present invention. FIG. 11 shows light signal intensity 1102 (e.g., visible and/or IR light) of signals 1110, 1112, 1114, and 1116 versus frequency (kHz) 1104. Signal 1112 may represent an ambient light signal (or signals, such as including visible and IR ambient light) having amplitude between Amp1 and Amp2 at a frequency (or frequencies) within frequency band B1, and/or less than frequency F1. In some cases, signal 1112 may represent signal 972, 982 and/or may include an amplitude for the ambient light at and near direct current (DC) frequency zero. Signal 1114 may represent an IR RC signal (or signals) having amplitude between Amp1 and Amp3 at a frequency (or frequencies) within frequency band B2, and/or between frequency F2 and F3. In some cases, signal 1114 may represent signal 954, 974 and/or 984. Signal 1110 may represent an IR proximity signal (or signals) having amplitude between Amp1 and Amp3 at a frequency (or frequencies) within frequency band B3, and/or between frequency F4 and F5. In some cases, signal 1110 may represent signal 950, 970 and/or 980. Signal 1116 may represent an IRDA signal (or signals) having amplitude between Amp1 and Amp3 at a frequency (or frequencies) within frequency band B4, and/or between frequency F6 and F7. In some cases, signal 1116 may represent signal 956, 976 and/or 986.

Signals 1110, 1114, and 1116 may be modulated signals (e.g., data or other signals modulated with or using an IR signal within each band). It is considered that signals 1110, 1114, and 1116 may be demodulated using a frequency and/or time demodulation filter, demodulator, and/or technique. Also, it can be appreciated that each of signals 1110, 1112, 1114, and 1116 may be in a larger or smaller frequency bandwidth and/or amplitude that that shown in the FIG. 11.

FIG. 9 shows proximity processor 920, which can be coupled to the output of proximity filter 910, so that signals filtered or passed by filter 910 may be received by processor 920. ALS processor 922 is also shown, which can be coupled to the output of ALS filter 912, so that signals filtered or passed by filter 912 may be received by processor 922. Likewise, IR remote control processor 924 is shown, which can be coupled to the output of IR remote control filter 914, so that signals filtered or passed by filter 914 may be received by processor 924. Finally, IRDA processor 926 is also shown, which can be coupled to the output of IRDA filter 916, so that signals filtered or passed by filter 916 may be received by processor 926. Proximity processor 920 is shown outputting signal 930, such as a digital signal determining or identifying a proximity, such as the proximity of object 990 to sensor S1, emitter E1, and/or chip 903. Also, processor 920 is shown outputting proximity transmit signal 940, such as an analog signal that when received by emitter E1 causes emitter E1 to transmit emitted IR proximity signal 950. Similarly, ALS processor 922 is shown outputting signal 932, such as a digital signal determining, identifying, or representing an ambient light component or portion. Also, IR remote control processor 924 is shown outputting signal 934, such as a digital signal including data, such as remote control commands, received from or in IR RC signal 974. Such remote control commands may include commands, instructions and/or control data (e.g., modulated on or in wireless IR RC signal 974, such as in packets or blocks of data) causing a host or electronic device including device 901 and/or electronically coupled to device 901 to perform an act or adjust a setting (e.g., increase/decrease volume, forward/reverse to next song track of audio play). Digital data of signal 934 may be demodulated from signal 974 by processor 924. Also, processor 924 is shown outputting RC transmit signal 944, such as an analog signal that when received by emitter E1 causes emitter E1 to emit emitted IR RC signal 954.

Also, IRDA processor 926 is shown outputting signal 936, such as a digital signal including data, such as IRDA data, received from or in IRDA signal 976. Such IRDA data may include audio, images and/or video media (e.g., modulated on or in wireless IRDA signal 976, such as in packets, files, or blocks of data and/or of compressed data) causing a host or electronic device including device 901 and/or electronically coupled to device 901 to store, save, play (e.g., as audio signals out of a speaker), and/or display data (or media, e.g., as an image and/or as video). According to embodiments, IRDA defines physical specifications communications protocol standards for the short range exchange of data over IR light, for uses such as personal area networks (PANs), very short-range free-space optical communications (e.g., between palmtop computers, mobile phones and the like), and/or between devices having a direct line of sight. Digital data of signal 936 may be demodulated from signal 976 by processor 926. Also, processor 926 is shown outputting IRDA transmit signal 946, such as an analog signal that when received by emitter E1 causes emitter E1 to emit emitted IRDA signal 956.

Signals 930, 932, 934 and 936 are received by microcontroller 960, such as by being multiplex or other words communicated as digital outputs 937. Microcontroller 960 is shown, which can be coupled to host controller 962, such as to communicate data between controller 960 and controller 962, and/or between. For example, controller 962 may send instructions or data, and/or receive instructions or data from controller 960. Microcontroller 960 may also communicate data between the processors and the host controller, such as to control the processors (and sensor/emitters) and receive sensed or detected analog and digital data from the sensors to report (or to report results based on) to the host.

Signals 940, 944 and 946 are shown received at the input of MUX 1. MUX 1 may be controlled by controller 960, such as to select any single, combination of, or all of signals 940, 944 and 946 to be output or transmitted to emitter E1 during a period of time. Thus, emitter E1 may emit any single, any combination of, or all of signals 950, 954 and 956 simultaneously (e.g., during or over the same period of time). In some cases, integrated sensor and emitter device 901 may be detecting signals 910, 972, 974 and 976; and emitting signals 950, 954 and/or 956 simultaneously. For instance, in FIG. 9, emitter E1 may emit signals 950, 954 and 956 simultaneously or during different periods of time. In some embodiments, controller processors 920, 922, 924 and/or 926 may cause signals 950, 954 and 956 to each be emitted during the same period of time (e.g., by sending a signals to emitter E1).

Signals 950, 954 and 956 may each be in a different frequency band. For example, signal 950 may be any of a number of emitted IR proximity signals having different frequencies but within a range of frequencies or frequency band. A similar concept applies to signals 954 and 956. Likewise, signals 970, 972, 974 and 976 may each be in a different band. Also, in some cases, signal 972 may cover or have signal components in a range of bands including those in which signals 970, 974 and 976 exist. However, components or components of signal 972 may be subtracted from signals 970, 974 and 976 by processor 920, 924 and 926, such as according to an ALS determination made my controller 960 or controller 962. Such an ALS determination may include or consider an ALS visible light and/or IR light signal (e.g., such as signal 932) received and processed by controller 960 and/or controller 962, such as to determine the component of signal 972 in the other IR bands (e.g., bands B2, B3, and B4).

For instance, filter 910 may subtract signals 982, 984 and 986 from signal 980, to pass signal 980, such as when emitter device 901 is sensing proximity. Similarly, filter 922 may subtract signals 980, 984 and 986 from signal 982, to pass signal 982, such as when emitter device 901 is sensing light or ambient light. Also, filter 914 may subtract signal 980, 982 and 986 from signal 984, to pass signal 984, such as when emitter device 901 is sensing IR data or IR RC data. Finally, filter 916 may subtract signals 980, 982 and 984 from signal 986, such as to pass signal 986 when emitter device 901 is sensing IR data or IRDA data. In some embodiments, IR RC signals and IRDA signals may be described as IR data signals. For example, signals 984 and 986 may be described at detected IR data signals, while signals 954 and 956 may be described as emitted IR data signals. It can be appreciated that these signals may be described as data communication signals or "data signals" because the RC and IRDA signals include data, such as RC commands and IRDA data, respectively.

Moreover, in some cases subtraction of signals 984 and 986, such as to pass signal 980 or 982, may be described as subtracting an IR data signal. A corresponding concept applies with respect to passing an IR data signal. Thus, in some embodiments, signal 980 and/or 982 may be subtracted from signals 984 and 986, such as to pass signals 984 and 986, which may be described as passing detected IR data signals. A similar concept also applies to emitting signals 954 and 956. Thus, signals 954 and 956 may be emitted, such as to be described as emitted IR data signals. In fact, it can be appreciated that throughout emitter device 901, a combination of receiving, detecting, filtering, processing, transmitting (e.g., such as signals 946 and 940, which may be described as transmit data signals), and emitting of a data signal may describe either or both a RC signal or an IRDA signal.

In order to decode or demodulate data from the detected or passed signal, processors 924 and 926 may include decoders and/or demodulators. For example, processor 924 may include a decoder and/or demodulator to demodulate RC commands or instructions that are modulated on an IR carrier to form signal 974. The demodulated signal may then be or not be decoded to produce output 934. Likewise, for example, processor 926 may include a decoder and/or demodulator to demodulate IRDA data that are modulated on an IR carrier to form signal 976. The demodulated signal may then be or not be decoded to produce output 936.

A similar concept for demodulating and decoding using processor 924 and 926 applies to generating or creating transmit signal 940 and 946. For example, processor 924 may or may not encode commands or instructions as a data signal and then may modulate that data signal to create transmit signal 944. Likewise, for example, processor 926 may or may not encode commands or instructions as a data signal and then may modulate that data signal to create transmit signal 946.

It can be appreciated that the term "sensor" may describe a single electronic and/or light sensing device or component, such as a sensor diode, or multiple electronic and/or light components. Such components may include an light detecting diode, photodiode, phototransistor, diode, operational amplifier (OA), resistors, other circuitry, a visible and IR light filter or cover (such as to cover the sensor diode and pass visible and IR light), an IR light filter or cover (such as to cover all or portions of the IR diode, to pass IR light, but not to pass visible light), and/or other light components.

Similarly, the term "emitter" may describe a single electronic and/or IR light device or component, such as an IR emitter, an IR transmitter, photodiode, phototransistor and/or an IR light emitting diode (LED). Alternatively, the term "emitter" may be used to describe more than one electronic and/or IR light device or component, such as an IR LED, a resistor, a multiplexer, an OA, a visible and IR light filter (such as to cover the IR emitter and pass visible and IR light), an IR light filter (such as to cover the IR emitter, not to pass visible light, but to pass IR light), and/or other IR light components. It is also considered that a "combined sensor and emitter device" or "integrated sensor and emitter device" may describe a single device or a single IC chip, such as chip 903 (which excludes object 990), including a sensor and/or IR emitter, and optionally other electronic devices or hardware.

Moreover, a sensor, an emitter, an apparatus, an integrated sensor and emitter, and/or an integrated device as described herein may be part of and/or electronically coupled to an electronic device or "host", such as a computer, television, portable media player, telephone, cell phone, other portable devices, video player, MP3 player, other audio player, remote control controller and/or receiver, infrared (IR) data association emitter and/or receiver, personal digital assistants (PDAs), and the like.

Also, the terms amplitude, level, intensity, magnitude, and amount may be used to describe an intensity of an light signal (e.g., wireless), such as with respect to time, wavelength and/or frequency. In some cases, any of those terms may describe an electronic signal representation either resulting from detection of such a signal (e.g., wireless) or causing emission of such a signal (e.g., wireless).

FIG. 9 also shows fence 992 such as a non-IR transmissive fence between sensor S1 and emitter E1. For example, fence 992 may be used in configurations where a cover (such as a plastic or protective covering) covers over sensor S1 and emitter E1, and/or device 901. Fence 992 may be disposed between the emitter and detector and may be configured to remove IR radiation emitted by the emitter (e.g., that may reflect or refract emitted signals 950, 954 and 956), such as to prohibit the emitted IR radiation from being directly incident upon sensor S1 (e.g., reflected or refracted signals 950, 954 and 956). Thus, fence 992 may be configured to prohibit such reflected or refracted signals from entering sensor S1. Fence 992 may be a fence that is antireflective or non-transmissive for radiation of emitter E1. Fence 992 may be disposed between emitter E1 and sensor S1, extending all the way up to the covering, to minimize erroneous readings caused by the sensor receiving radiation emitted by emitter E1, refracted by the cover. According to some embodiments, fence 992 may be excluded or not present in device 901 (e.g., optional).

Any or all of the components of integrated sensor and emitters device 901 may exist in or on chip 903. For example, sensor S1 and emitter E1 may exist on the same IC chip, chip 903. In addition to the sensor and emitter, various other electronic and/or light components of device 901 may exist on chip 903 as well. For example, all of the components shown for device 901 except for controller 962 and fence 992 may exist in or on chip 903. In addition, fence 992 may be mounted on, above, or over chip 903. Host controller 962 may be on another chip and interface through contacts to chip 903. Moreover, sensor S1, emitter E1 filters 910, 912, 914 and 916; processors 920, 922, 924 and 926; and MUX 1 (and optionally microcontroller 960) may exist on chip 903. Also, various combinations of filters 910, 912, 914 and 916; processors 920, 922, 924 and 926; and/or controller 960 and MUX 1 may exist on chip 903. In some cases, emitter E1 may not be on chip 903 or may be on a separate chip than chip 903.

Using filters 910, 912, 914 and/or 916 to pass signals 980, 982, 984 and/or 984 according to a band pass, low pass, or frequency band may be described as frequency division multiplexing, such as using the different frequency band filters (e.g., to filter or pass different signals in various frequency bands received or detected during the same period of time).

Figure 10:
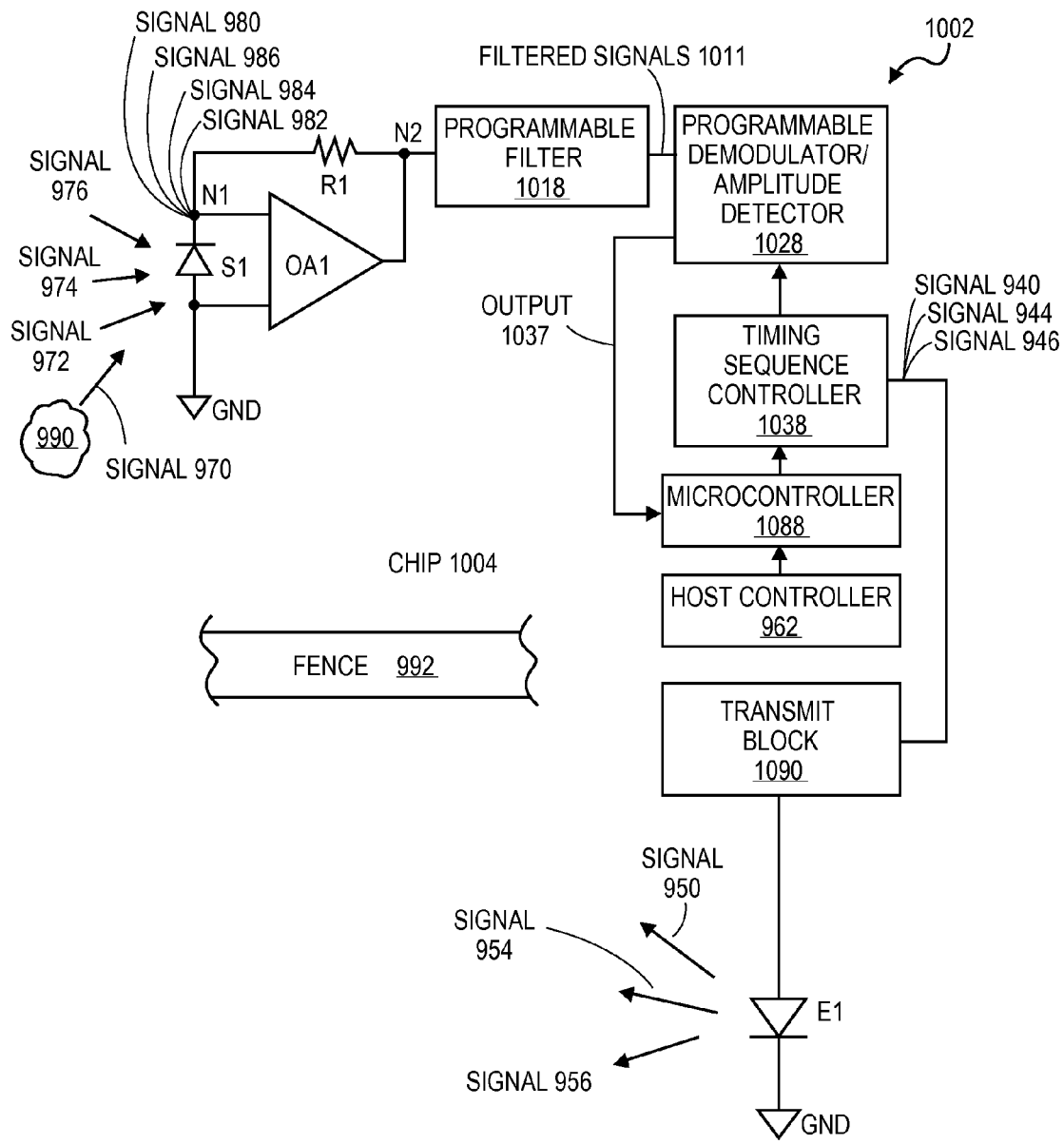
FIG. 10 shows a schematic of an integrated sensor and emitter in accordance with one embodiment of the present invention.

According to some embodiments, signals 980, 982, 984 and 986 may be filtered or passed by time division multiplexing. For example, FIG. 10 shows a schematic of an integrated sensor and emitter in accordance with one embodiment of the present invention. FIG. 10 shows integrated sensor and emitter device 1002 (e.g., "an integrated device" or "device 1002"), including one or more electronic and/or IR light devices. In some embodiments, device 1002 may perform the same functions as device 901. Thus, device 1002 is shown including components and signals similar to those of device 901. However, device 1002 can include programmable filter 1018, which can be coupled to node N2, programmable demodulator/amplitude detector 1028 coupled to the output of programmable filter 1018, such as to receive signals passed by programmable filter 1018. Timing sequence controller 1038 can be coupled to detector 1028 and microcontroller 1088. Microcontroller 1088 can be coupled to host controller 962. Instructions and data may be communicated between (e.g., among) controller 1038, controller 1088 and/or controller 962. In addition, controller 1038 may provide timing sequences for time division multiplexing ("TDM") to be implemented by detector 1028.

Detector 1028 is also shown coupled to microcontroller 1088, such as to communicate output 937 to controller 1088. Output 937 may include signals 930, 932, 934 and 936 as described for FIG. 9.

Controller 1038 is also shown coupled to transmit block 1090 to communicate signals 940, 944 and 946 to block 1090. Transmit block 1090 may provide signal 940, 944 and/or 946 to emitter E1 to be emitted as signals 950, 954 and 956 respectively.

Filter 1018, detector 1028, controller 1038 and block 1090 (an optional controller 1088) may be described as detecting, filtering, processing and/or emitting signals according to TDM, and for example, may be described as a single TDM filter. For example, filter 1018 may be used to select between a frequency band of or that includes signal 980, 982, 984 and/or 986, such as to pass any one, any combination of, or all of signals 980, 982, 984 and 986 to detector 1028. Detector 1028 may be used to select between the passed signals, such as by selecting between a period of time for detecting, demodulating and/or decoding signal 980, 982, 984 and/or 986. More specifically, detector 1028 may select between periods of time for the passed signals, and then may demodulate the period of time including the selected signal, such as to demodulate the period of time of passed signal 980, 982, 984 or 986.

It can be appreciated that such filtering, detecting, demodulating and/or encoding may perform the functions corresponding to those described for FIG. 9. Specifically, filter 1018 may output filtered signals 1011 to pass the frequencies or frequency bands as described above for filter 910, 912, 914 or 916. Also, detector 1028 may demodulate and pass a period of time of filtered signals 1011 received from filter 1018, as output 1037. Output 1037 may be a period of time of any of signals 930, 932, 934 or 936.

Transmit block 1090 may output signals 940, 944 or 946 during different periods of time to be emitted by emitter E1. For example, controller 1038 and/or block 1090 may control sending signal 940 to emitter E1 to be transmitted as signal 950 when device 1002 is sensing proximity or emitting a proximity signal. Likewise, controller 1038 and/or block 1090 may send signal 944 to emitter E1 to be transmitted as signal 954 when device 1002 is emitting IR data or an IR RC signal. Next, controller 1038 and/or block 1090 may send signal 946 to emitter E1 to be transmitted as signal 956 when device 1002 is emitting IR data or an IRDA signal.

Consequently, in FIG. 10, emitter E1 may emit signals 950, 954 and 956 simultaneously or during different periods of time. In some embodiments, controller 1038 and/or lock 1090 may cause signals 950, 954 and 956 to each be emitted during different periods of time (e.g., by sending a signals to emitter E1).

It can be appreciated that the descriptions above for FIG. 9 with respect to IR data signals, emitted IR data signals and detected IR data signals (e.g., where a data signal is a RC signal and/or an IRDA signal) apply to FIG. 10 as well. Similarly, descriptions above with respect to any or all of the components of device 901 being on chip 903 apply to components of device 1002 being on chip 1004 (which excludes object 990). For example, sensor S1 and emitter E1 may both exist in or on chip 1004. In addition to the sensor and emitter, various other electronic and/or light components of device 1002 may exist on chip 1004 as well. For example, all of the components shown for device 1002 except for controller 962 and fence 992 may exist in or on chip 1004. In addition, fence 992 may be mounted on, above, or over chip 1004. Host controller 962 may be on another chip and interface through contacts to chip 1004. Moreover, sensor S1, emitter E1 filter 1018, detector 1028, controller 1038, and block 1090 (and optionally microcontroller 1088) may exist on chip 1004. Also, various combinations of filter 1018, detector 1028, controller 1038, and block 1090 may exist on chip 1004. In some cases, emitter E1 may be on a separate chip than chip 1004. According to some embodiments, chip 903 and chip 1004 will include the components described above, except that emitter E1 will not be on chip 903 or chip 1004, such as by being on another chip and/or interfaced with MUX 1 and block 1090, respectively, by electrical contact or connection.

Figure 12:
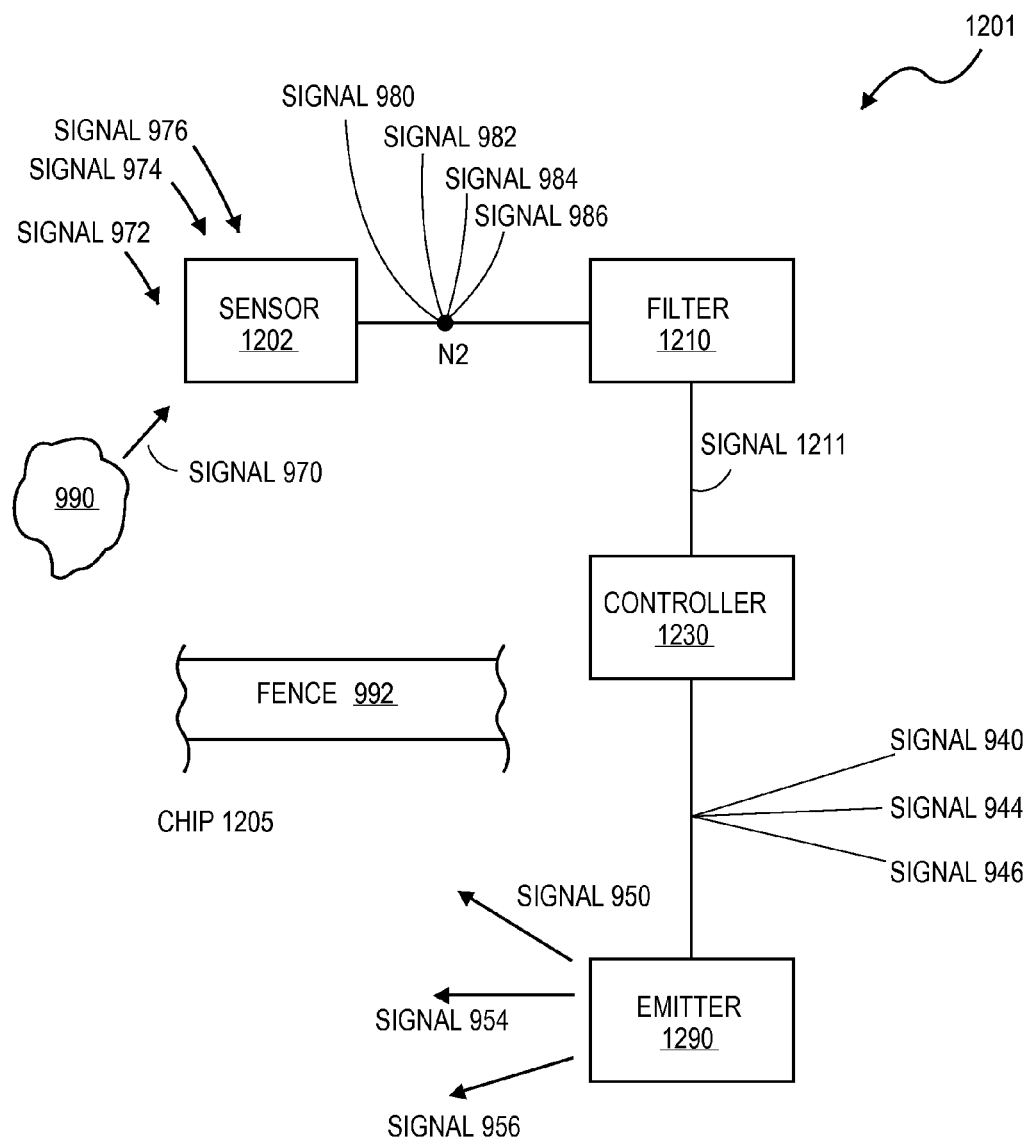
FIG. 12 shows a block diagram of an integrated sensor and emitter in accordance with one embodiment of the invention.

FIG. 12 shows a block diagram of an integrated sensor and emitter in accordance with one embodiment of the invention. FIG. 12 shows integrated sensor and emitter device 1201 (e.g., "an integrated device" or "device 1201"), including one or more electronic and/or IR light devices. FIG. 12 shows device 1201 including sensor 1202 coupled through node N2 to filter 1210, which can be coupled to controller 1230, which is coupled to emitter 1290. FIG. 12 also shows fence 992 disposed between sensor 1202 and emitter 1290.

In some embodiments, device 1201 may perform the same functions as device 901 and/or 1002. Thus, device 1201 is shown including components and signals similar to those of device 901 and/or 1002. Specifically, device 1201 can include sensor 1202 which may be similar to sensor S1 (e.g., and may include amplifier OA1 and resistor R1 circuitry/network). Thus, sensor 1201 may detect signals 970 (e.g., signal 950 reflected by object 990), 972, 974, and/or 976 and generate corresponding signals 870, 872, 874, and/or 876, which are passed to filter 1210. Filter 1210 may be or may perform the functionality of one or more filters similar to filter 910, 912, 914, 916, and/or 1018. Thus, filter 1210 may pass signals 870, 872, 874, and/or 876 as passed or filtered signals 1211 (e.g., such as a signals containing signals 911, 913, 915, 917, and/or 1011) to controller 1230, simultaneously or during different periods of time. Controller 1230 may include or may perform the functionality of one or more processors (e.g., similar to processors 920, 922, 924, and/or 926), microcontrollers (e.g., similar to microcontroller 960, 962, and/or 1088), programmable demodulator/amplitude detectors (e.g., similar to detector 1028), and/or timing sequence controllers (e.g., similar to controller 1038). Thus, controller 1230 may pass signals 940, 944 and/or 946 to emitter 1290 simultaneously or during different periods of time, such as to cause the emitter to emit signals 950, 954 and/or 956. Emitter 1290 may be an emitter similar to or may perform the functionality of emitter E1, multiplexer MUX 1 and/or block 1090. Thus, emitter 1290 may emit signals 950, 954 and/or 956 simultaneously or during different periods of time. It can be appreciated that device 1201 can detect and/or emit IR signals according to a frequency domain scheme (e.g., using frequency domain multiplexing) or according to a time domain scheme (e.g., using time domain multiplexing) as described herein.

It can be appreciated that the descriptions above for FIG. 9 with respect to IR data signals, emitted IR data signals and detected IR data signals (e.g., where a data signal is a RC signal and/or an IRDA signal) apply to FIG. 12 as well. Similarly, descriptions above with respect to any or all of the components of device 901 being on chip 903 apply to components of device 1201 being on chip 1205 (which excludes object 990). For example, sensor 1202 and emitter 1290 may both exist in or on chip 1205. In addition to the sensor and emitter, filter 1210 and controller 1230 may exist on chip 1205 as well. According to some embodiments, chip 1205 will include the components described above, except that emitter 1290 will not be on chip 1205, such as by being on another chip and/or interfaced with controller 1230, by electrical contact or connection.

According to embodiments, chip 903, 1004, and/or 1205 may include or be a single integrated circuit (IC) chip to perform any combination of detection, filtering, demodulating, de-multiplexing, processing, modulating, and emitting functions described herein (e.g., for devices 901, 1002 and/or 1201). In some cases, chip 903, 1004, and/or 1205 may include a single IC chip to sense proximity, to IR data signals, and to sense light by including an emitter of an IR proximity signal, and a sensor configured to detect the IR proximity signal from the emitter when the apparatus is sensing proximity, to detect IR data signals when the apparatus is detecting IR data, and to detect ambient light when the apparatus is sensing ambient light. The detected IR data signals may include an IR RC signal that the sensor is configured to detect when the apparatus is sensing IRRC signals, and an IRDA signal that the sensor is configured to detect when the apparatus is sensing IRDA signals. Also, the emitter may be configured to emit the IR proximity signal when the apparatus is detecting proximity and emitted IR data signals when the apparatus is emitting IR data signals. The emitted IR data signals include an IR remote control (RC) signal when the apparatus is emitting an IRRC signal and an IRDA signal when the apparatus is emitting an IRDA signal.

Such an IC chip may further include a filter (e.g., processing logic) coupled to the emitter and/or to the sensor, configured to filter out or pass the detected signals, such as using multiple frequency division multiplexing filters (e.g., according to different frequency bands); or using a single time division multiplexing filter, as described herein. Such an IC chip may further include a processor (e.g., processing logic) coupled to the filter, configured to process the filtered signals, such as to demodulate data carried or modulated with or onto IR modulation signals. Moreover, a "chip" may describe a controller, a microcontroller, a microcontroller unit (MCU), a programmable system on a chip device, a die, an integrated circuit (IC), and/or a single monolithic semiconductor substrate.

According to embodiments, the functionality described above (e.g., for any combination of detection, filtering, demodulation, de-multiplexing, processing, modulating, and emitting functions described herein for devices 901, 1002 and/or 1201) may be implemented using a phone (e.g., a telephone or cell phone). In some cases, the phone may include an integrated sensor or receiver, and an integrated wireless transceiver (e.g., a wireless cellular transceiver). The transceiver may transmit and receive wireless telephony communications or data, when the phone is communicating by telephony; and the sensor may be configured to receive and detect RC commands from an RC signal to control the phone (e.g., causing the phone to changing a setting and/or perform an act). The sensor may be configured to detect IRDA signals to provide data to the phone, the phone may include personal digital assistant (PDA) capabilities. Consequently, the phone may be a portable device or a hand held phone.

According to embodiments, the functionality described above (e.g., for any combination of detection, filtering, demodulation, de-multiplexing, processing, modulating, and emitting functions described herein for devices 901, 1002 and/or 1201) may be implemented using an integrated device to send or receive RC commands, and to sense proximity. Such an apparatus may include an emitter of IR radiation configured to transmit an IR proximity signal; and a sensor configured to detect the IR proximity signal from the emitter when the apparatus is sensing proximity. Either the emitter may be configured to emit IR RC signals when the apparatus is sending RC commands, and/or the sensor may be configured to detect IR RC signals when the apparatus is receiving RC commands (e.g., the apparatus has RC control functionality). Such an IR emitter may be configured to emit IRDA signals when the apparatus is sending IRDA data, and/or such a sensor may be configured to detect IRDA signals when the apparatus is receiving IRDA data (e.g., the apparatus has IRDA functionality).

In addition, according to embodiments, the functionality described above (e.g., for any combination of detection, filtering, demodulation, de-multiplexing, processing, modulating, and emitting functions described herein for devices 901, 1002 and/or 1201) may be implemented using an integrated device to send or receive RC commands, and to sense ambient light. Such an apparatus may include an emitter of IR radiation; and a sensor configured to detect ambient light when the apparatus is sensing ambient light. Either the emitter may be configured to emit IR RC signals when the apparatus is sending RC commands, and/or the sensor may be configured to detect IR RC signals when the apparatus is receiving RC commands. Such an IR emitter may be configured to emit IRDA signals when the apparatus is sending IRDA data, and/or such a sensor may be configured to detect IRDA signals when the apparatus is receiving IRDA data.

Next, according to embodiments, the functionality described above (e.g., for any combination of detection, filtering, demodulation, de-multiplexing, processing, modulating, and emitting functions described herein for devices 901, 1002 and/or 1201) may be implemented using an apparatus or device (e.g., a single device, chip, or integrated device) to sense proximity, to sense infrared (IR) data signals, and to sense ambient light, where the apparatus can include a data processor, a memory electronically coupled to the data processor, an emitter of an IR proximity signal (such as emitter E1 emitting signal 950) electronically coupled to the data processor, and three sensors (each, such as sensor S1). The first sensor may be electronically coupled to the data processor and configured to detect the IR proximity signal (e.g., signal 970) from the emitter when the apparatus is sensing proximity. The second sensor may be electronically coupled to the data processor and configured to detect IR data signals (e.g., signal 976 and/or 974) when the apparatus is detecting IR data. The third sensor may be electronically coupled to the data processor and configured to detect ambient light (e.g., signal 972) when the apparatus is sensing ambient light.

In some cases, the apparatus may further include a second emitter configured to emit IR data signals when the apparatus is emitting IR data signals (such as another of emitter E1 emitting signal 954 and/or 956). Also, the data processor may further include a filter configured to pass the detected IR proximity signal as a filtered proximity signals (such as filter 910) when the apparatus is sensing proximity, pass the detected IR data signals as a filtered IR data signals (such as filter 914 and/or 916) when the apparatus is sensing IR data, and pass the detected ambient light as a filtered ambient light signals (such as filter 912) when the apparatus is sensing ambient light. Moreover, the data processor may be configured to identify a proximity (e.g., proximity of object 990) using the passed IR proximity signal when the apparatus is sensing proximity, identify data (e.g., RC commands and/or IRDA data) using the passed IR data signals when the apparatus is sensing IR data, and identify an ambient light level using the passed ambient light when the apparatus is sensing ambient light. Also, the data processor may further include a plurality of frequency division multiplexing filters, or a single time division multiplexing filter to filter the detected IR proximity signal, the detected IR data signals, and the detected ambient light.

According to embodiments, the functionality described above (e.g., for any combination of detection, filtering, demodulation, processing, modulating, and emitting functions described herein for devices 901, 1002 and/or 1201) may be implemented using a machine readable medium containing executable program instructions which, when executed, cause a method of operating a data processing system, device 901, device 1002, device 1201 and/or components thereof, as described herein. For example, such program instructions may be used to perform the functionality or control the functionality of filter 910, 912, 914, 916, 1018 and/or 1210. Similarly, such instructions may be used to perform the functionality or control the functionality of sensor 1202, processor 920, 922, 924, 926, detector 1028, controller 1088, controller 1230, emitter 1290, block 1090 and/or controller 962, as described herein.

Also, a sensor, emitter, integrated device, filter, microcontroller, processor, and/or "processing logic" as described herein may describe an apparatus, an electronic device, a processor, processing logic, a state machine, passive circuitry, active circuitry, electronic hardware, software, a system, a module, a component, a processor, a memory, registers and/or a combination of any or all of the above. Moreover, according to embodiments, sensor S1 and 1210 may be described as being "configured to detect" signals 970, 972, 974 and 976 as described herein, such as to generate or create detected signals 980, 982, 984 and 986, respectively. Specifically, being "configured to detect" may describe the capability of a sensor to detect or sense different wavelengths, wavelength bands (e.g., visible and/or IR light), wavelength peaks, frequencies, frequency bands and/or frequency peaks of electromagnetic radiation depending on the wavelengths of emitted radiation, modulation of emitted radiation, and passed frequencies or time periods of filters. Likewise, emitter E1 and 1290 may described as being "configured to emit" signals 950, 954 and 956 as described herein, such as by generating or creating those signals upon receipt of signals 940, 944 and 946, respectively. Specifically, being "configured to emit" may describe the capability of an emitter to emit or transmit different wavelengths, wavelength bands (e.g., visible and/or IR light), wavelength peaks, frequencies, frequency bands and/or frequency peaks of electromagnetic radiation depending on the wavelengths of data and/or modulation signals. It can be appreciated that the concept of being "configured to" perform a function applies to filters, processors, controllers, multiplexers and other components of device 901, 1002 and device 1201. In addition, the functionality described above (e.g., for any combination of detection, filtering, demodulation, de-multiplexing, processing, modulating, and emitting functions described herein for devices 901, 1002 and/or 1201) may be performed or implemented when the apparatus (e.g., devices 901, 1002 and/or 1201 or components thereof) are sensing and/or emitting IR proximity signals, ambient light signals, RC signals, and/or IRDA signals, as appropriate.

It can be appreciated that the integrated sensor and emitter concepts described above, such as to use sensor S1 or 1210 to sense multiple visible and/or IR light signals, and are using emitter E1 or 1290 to emit multiple IR signals as described herein may reduce hardware, costs, power consumption, geographic space or area required by device 901, 1002 and device 1201 as compared to non-integrated sensor and emitters. For example, as compared to sensor and emitter devices that require more than one sensor and/or more than one emitter to perform the same functionality or combination of functionalities described herein. In some cases, by using only sensor S1 or 1210 to detect signal 980, 982, 984 and/or 986, instead of using more than one sensor, device 901, device 1002, device 1201, chip 903, chip 1004 and/or chip 1205 may save space or area of or on the chip, such as to be used for other electronic and/or light devices. Similarly, in some cases, by using only emitter E1 or 1290 to emit signal 950, 954 and/or 956, instead of using more than one emitter, device 901, device 1002, device 1201, chip 903, chip 1004 and/or chip 1205 may save space or area of or on the chip, such as to be used for other electronic and/or light devices.

Moreover, using the integrated sensor and emitter reduces the number of components that may fail, and thus may reduce failure rates. For example, using a single sensor S1 or 1210 and/or a single emitter E1 or 1290 to perform the function as described herein as opposed to using two sensors and/or two emitters may reduce the failure rate of the sensors and/or emitters hardware by one half.

In addition, according to embodiments, descriptions herein with respect to portable devices (e.g., see FIGS. 1-6), proximity, light levels (e.g., ambient light), generating detection of proximity and/or light levels (e.g., see FIGS. 7A-7D), using artificial intelligence (AI) logic on inputs from sensors to take actions (e.g., see FIG. 8), and digital processing systems for sensors (e.g., see FIG. 13) apply to devices 901, 1002 and/or 1201, portions, components, logic, emitters and sensors thereof. Moreover, according to embodiments, descriptions herein with respect to placement and location of sensors; use of sensor data and determinations; and multiple sensors also apply to devices 901, 1002 and/or 1201. For example, devices 901, 1002 and/or 1201 can be used at locations identified herein for a proximity sensor, RC receiver and/or emitter, IRDA receiver and/or emitter, and/or a light level sensor, such as to substitute one integrated sensor and emitter device to take the place of two or more emitters and/or sensors. Thus, each such substitution only requires the reduced space, power, processing, and openings in the surface of the portable device of one integrated device, as compared to the two or more emitters and/or sensors.

It will be appreciated that at least some of the sensors which are used with embodiments of the inventions may determine or provide data which represents an analog value. In other words, the data represents a value which can be any one of a set of possible values which can vary continuously or substantially continuously, rather than being discrete values which have quantum, discrete jumps from one value to the next value. Further, the value represented by the data may not be predetermined. For example, in the case of a distance measured by a proximity sensor, the distance is not predetermined, unlike values of keys on a keypad which represent a predetermined value. For example, a proximity sensor may determine or provide data that represents a distance which can vary continuously or nearly continuously in an analog fashion; in the case of such a proximity sensor, the distance may correspond to the intensity of reflected light which originated from the emitter of the proximity sensor. A temperature sensor may determine or provide data that represents a temperature, which is an analog value. A light sensor, such as an ambient light sensor, may determine or provide data that represents a light intensity which is an analog value. A motion sensor, such as an accelerometer, may determine or provide data which represents a measurement of motion (e.g. velocity or acceleration or both). A gyroscope may determine or provide data which represents a measurement of orientation (e.g. amount of pitch or yaw or roll). A sound sensor may determine or provide data which represents a measurement of sound intensity. For other types of sensors, the data determined or provided by the sensor may represent an analog value.

Figure 8:
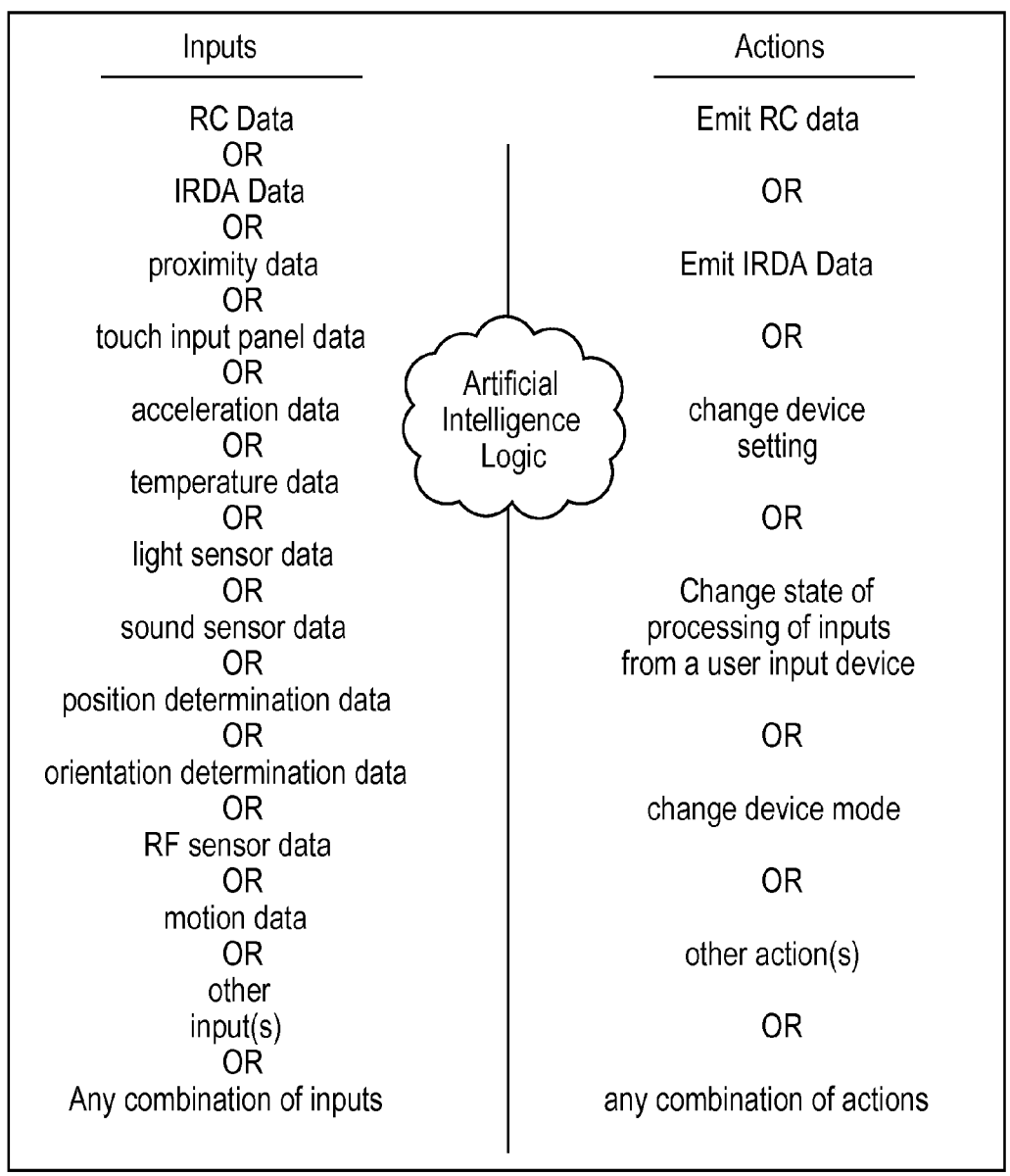
FIG. 8 is a block diagram of inputs and outputs for logic, such as artificial intelligence logic, in accordance with embodiments of the present invention.

FIG. 8 shows a diagram of various inputs from sensors that can be used and actions that can be performed in accordance with at least one embodiment of the invention. Any one of the devices described herein, including the devices shown in FIGS. 2, 3, 4, 5, 9-10 and 12-13, may operate in accordance with the use of artificial intelligence as represented by FIG. 8. One or more inputs on the left side of FIG. 8 are received from various sensors of a device and are input into the artificial intelligence (AI) logic. One or more actions on the right side of FIG. 8 may be implemented by the AI logic automatically in response to any combination of the inputs. In one implementation of this embodiment, the actions are implemented substantially immediately after the data is sensed by one or more sensors.

Exemplary inputs of FIG. 8 may include, for example, RC data, IRDA data, proximity data, proximity data and blob detect data (e.g., from a multipoint touch input screen), proximity data and accelerometer data, accelerometer data and blob detect data, proximity data and temperature data, proximity data and ambient light data, and numerous other possible combinations.

Exemplary actions of FIG. 8 may include, for example, emitting RC data, causing a host or electronic device to perform an act or adjust a setting, emitting IRDA data, causing a host or electronic device to store, save, play and/or display media, turning off the backlight of the portable device's display, suppressing the user's ability to input at the user interface (e.g., locking the input device), changing the telephone's mode, and the like. It will be appreciated that combinations of the above actions may also be implemented by the AI logic. For example, the AI logic may both turn off the display's backlight and suppress the user's ability to input at the user interface. As another example, the proximity data from a proximity sensor may be used to adjust the frequency response of the output of a receiver's amplifier section. This adjustment would allow the amplifier section to compensate for the variation of frequency response which occurs as a result of the variation of the distance between a speaker and a user's ear. This variation is caused by the variation of signal leakage introduced by a varying distance between the speaker and the user's ear. For example, when the ear is close (in close proximity) to the speaker, then the leak is low and the base response is better than when the ear is not as close to the speaker. When the speaker is farther removed from the ear, the degraded base response may be improved, in at least certain embodiments, by an equalizer which adjusts the base relative to the rest of the output signal in response to the distance, measured by the proximity sensor, between the user's ear and the speaker which provides the final output signal.

AI logic of FIG. 8 performs an AI (artificial intelligence) process. In certain embodiments, the AI process may be performed without a specific, intentional user input or without user inputs having predetermined data associated therewith (e.g., key inputs). The artificial intelligence process performed by the AI logic of FIG. 8 may use a variety of traditional AI logic processing, including pattern recognition and/or interpretation of data. For example, the AI logic may receive data from one or more sensors and compare the data to one or more threshold values and, based on those comparisons, determine how to interpret the data. In one embodiment, a threshold value may represent a distance which is compared to a value derived from a light intensity measurement in a proximity sensor. A light intensity measurement which represents a distance larger than the threshold value indicates that the object (which reflected the emitter's light) is not near, and a light intensity measurement which represents a distance smaller than the threshold value indicates that the object is near. Further, the input data may be subject to at least two interpretations (e.g. the data from a proximity sensor indicates that the user's head is near to the sensor, so turn off the back light, or the data from the proximity sensor indicates the user's head is not near, so leave the backlight under the control of a display timer), and the AI process attempts to select from the at least two interpretations to pick an interpretation that predicts a user activity. In response to the interpretation (e.g. the selection of one interpretation), the AI logic causes an action to be performed as indicated in FIG. 8, wherein the action may modify one or more settings of the device.

Figure 13:
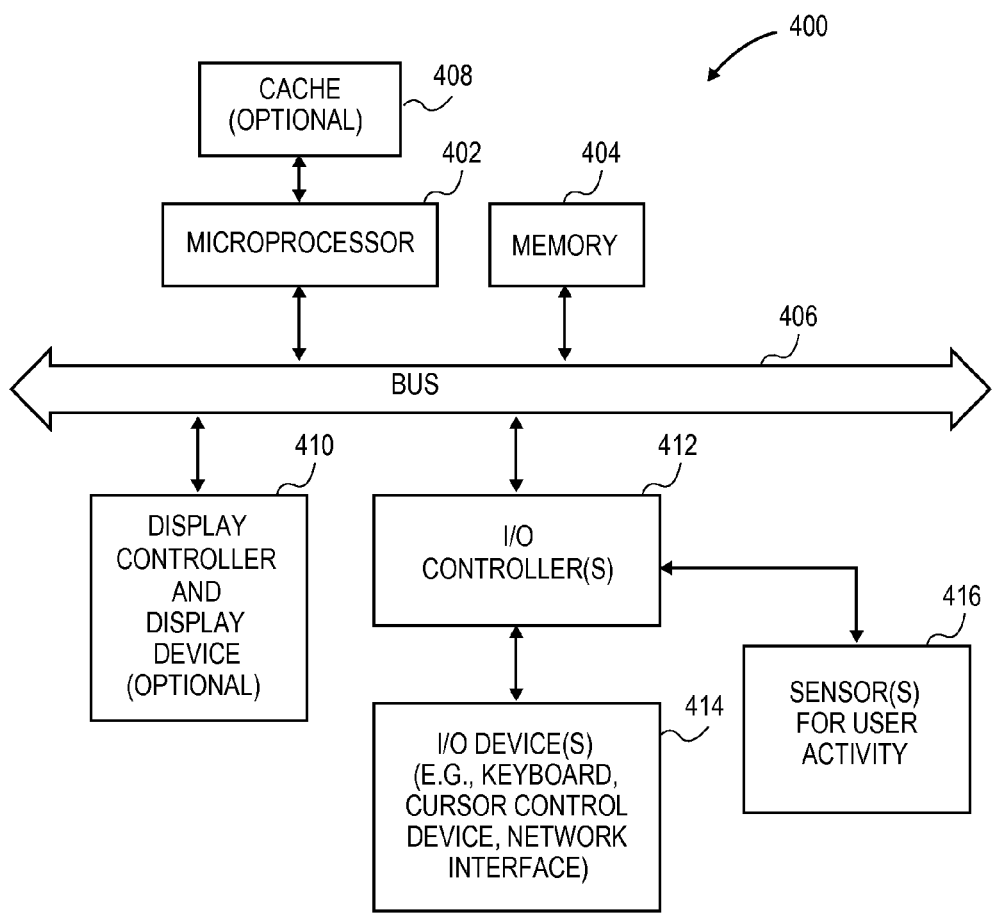
FIG. 13 is a block diagram of a digital processing system in accordance with one embodiment of the present invention.

FIG. 13 shows another example of a device according to an embodiment of the inventions. This device may include a processor, such as microprocessor 402, and a memory 404, which are coupled to each other through a bus 406. The device 400 may optionally include a cache 408 which can be coupled to the microprocessor 402. This device may also optionally include a display controller and display device 410 which can be coupled to the other components through the bus 406. One or more input/output controllers 412 are also coupled to the bus 406 to provide an interface for input/output devices 414 and to provide an interface for one or more sensors 416 which are for sensing user activity. The bus 406 may include one or more buses connected to each other through various bridges, controllers, and/or adapters as is well known in the art. The input/output devices 414 may include a keypad or keyboard or a cursor control device such as a touch input panel. Furthermore, the input/output devices 414 may include a network interface which is either for a wired network or a wireless network (e.g. an RF transceiver). The sensors 416 may be any one of the sensors described herein including, for example, a proximity sensor or an ambient light sensor. In at least certain implementations of the device 400, the microprocessor 402 may receive data from one or more sensors 416 and may perform the analysis of that data in the manner described herein. For example, the data may be analyzed through an artificial intelligence process or in the other ways described herein. As a result of that analysis, the microprocessor 402 may then automatically cause an adjustment in one or more settings of the device.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus to sense proximity, to sense infrared (IR) data signals, and to sense ambient light, the apparatus comprising:
    an emitter of an IR proximity signal;
    a sensor configured to detect the IR proximity signal, an IR data signal, and an ambient light signal, wherein each of the IR proximity signal, the IR data signal, and the ambient light signal are in a different frequency band;
    a single time division multiplexing filter coupled to the sensor and configured to demodulate and pass the detected IR proximity signal when the apparatus is sensing proximity, the detected IR data signal when the apparatus is detecting IR data, and the detected ambient light signal when the apparatus is detecting ambient light, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller; and
    a microprocessor coupled to the single time division multiplexing filter and configured to process the passed IR proximity signal, the passed IR data signal, and the passed ambient light signal to operate the apparatus.

2. The apparatus of claim 1, wherein the IR data signal includes an IR remote control (IRRC) signal that the sensor is configured to detect when the apparatus is sensing IRRC signals, and an IR data association (IRDA) signal that the sensor is configured to detect when the apparatus is sensing IRDA signals.

3. The apparatus of claim 1, wherein the sensor is further configured to simultaneously detect the IR proximity signal, the IR data signal, and the ambient light signal.

4. The apparatus of claim 1, wherein the emitter is configured to emit the IR proximity signal when the apparatus is detecting proximity and to emit IR data signals when the apparatus is emitting IR data signals.

5. The apparatus of claim 4, wherein the emitted IR data signals include an IR remote control (IRRC) signal emission when the apparatus is emitting an IRRC signal emission and an IR data association (IRDA) signal emission when the apparatus is emitting an IRDA signal emission.

6. The apparatus of claim 5, wherein the emitter is further configured to simultaneously emit the IR proximity signal, IRRC signal emission, and IRDA signal emission.

7. The apparatus of claim 6, wherein each of the IR proximity signal, the IRRC signal emission, and the IRDA signal emission are emitted in a different frequency band.

8. The apparatus of claim 1, wherein the detected IR data signal includes an IR remote control (IRRC) signal that the sensor is configured to detect when the apparatus is sensing IRRC signals, and an IR data association (IRDA) signal that the sensor is configured to detect when the apparatus is sensing IRDA signals.

9. A method of operating an integrated sensor and emitter device to sense proximity, to sense infrared (IR) data signals, and to sense ambient light, the method comprising:
emitting an IR proximity signal from an emitter;
detecting the IR proximity signal from the emitter with a sensor when the integrated sensor and emitter device is sensing proximity;
detecting an IR data signal with the sensor when the integrated sensor and emitter device is detecting IR data and demodulating the detected IR data signal to extract data from the IR data signal, wherein the IR data signal comprises an IR remote control (IRRC) signal and an IR data association (IRDA) signal;
detecting an ambient light signal with the sensor when the integrated sensor and emitter device is sensing ambient light;
passing the IR proximity signal, the IRRC signal, the IRDA signal, and the ambient light signal through a single time division multiplexing filter coupled to the sensor to pass the detected IR proximity signal when the apparatus is sensing proximity, the detected IR data signal when the apparatus is detecting IR data, and the detected ambient light signal when the apparatus is detecting ambient light, wherein passing the IR proximity signal, the IRRC signal, the IRDA signal, and the ambient light signal through the single time division multiplexing filter further comprises:
selecting between a frequency band of the detected IR proximity signal, a frequency band of the IRRC signal, a frequency band of the IRDA signal, and a frequency band of the ambient light signal,
selecting between a period of time of the detected IR proximity signal, a period of time of the IRRC signal, a period of time of the IRDA signal, and a period of time of the ambient light signal, and
demodulating the period of time of the detected IR proximity signal, the period of time of the IRRC signal, the period of time of the IRDA signal, and the period of time of the ambient light signal; and
processing the IR proximity signal, the IRRC signal, the IRDA signal, and the ambient light signal to operate the apparatus.

10. The method of claim 9, wherein detecting the IR data signals further comprises:
detecting the IRRC signal with the sensor when the integrated sensor and emitter device is sensing IRRC signals;
detecting the IRDA signal with the sensor when the integrated sensor and emitter device is sensing IRDA signals;
simultaneously detecting the IR proximity signal from the emitter, the IRRC signal, the IRDA signal, and the ambient light signal with the sensor.

11. The method of claim 9 further comprising:
emitting IR data signals from the same emitter when the integrated sensor and emitter device is emitting IR data signals, wherein emitting the IR data signals further comprises:
emitting an IR remote control (IRRC) signal emission from the same emitter when the integrated sensor and emitter device is emitting an IRRC signal;
emitting an IR data association (IRDA) signal emission from the same emitter when the integrated sensor and emitter device is emitting an IRDA signal; and
simultaneously emitting the IR proximity signal, IRRC signal emission, and IRDA signal emission from the same emitter.

12. The method of claim 9, wherein passing the detected IR data signal through the single time division multiplexing filter when the integrated sensor and emitter device is sensing IR data further comprises simultaneously passing the detected IR proximity signal, the IRRC signal, the IRDA signal, and the ambient light signal.

13. The method of claim 9, further comprising:
processing the passed IR proximity signal using a processor when the integrated sensor and emitter device is sensing proximity;
processing the passed IR data signal using the processor when the integrated sensor and emitter device is sensing IR data, wherein processing the passed IR data signal comprises:
processing the passed IRRC signal using the processor when the integrated sensor and emitter device is sensing IRRC signals, and
processing the passed IRDA signal using the processor when the integrated sensor and emitter device is sensing IRDA signals;
processing the passed ambient light signal using the processor when the integrated sensor and emitter device is sensing ambient light;
simultaneously processing the passed IR proximity signal, the IRRC signal, the IRDA signal, and the ambient light signal;
emitting an IR remote control (IRRC) signal emission from the same emitter when the integrated sensor and emitter device is emitting an IRRC signal; and
emitting an IR data association (IRDA) signal emission from the same emitter when the integrated sensor and emitter device is emitting an IRDA signal.

14. A single integrated circuit (IC) chip of a mobile device to sense proximity, to sense infrared (IR) data signals, and to sense ambient light, the IC chip comprising:
an emitter of an IR proximity signal;
a sensor configured to detect IR light, the sensor configured to detect the IR proximity signal from the emitter when the mobile device is sensing proximity, to detect an IR data signal when the mobile device is detecting IR data, and to detect an ambient light signal when the mobile device is sensing ambient light, wherein each of the IR proximity signal, the IR data signal, and the ambient light signal are in a different frequency band, wherein the detected IR data signal includes an IR remote control (IRRC) signal that the sensor is configured to detect when the mobile device is sensing IRRC signals, and an IR data association (IRDA) signal that the sensor is configured to detect when the mobile device is sensing IRDA signals, wherein the IRRC signal, the IRDA signal, the IR proximity signal, and the ambient light signal are processed to operate the mobile device; and a single time division multiplexing filter coupled to the sensor and configured to demodulate and pass the detected IR proximity signal when the apparatus is sensing proximity, the detected IR data signal when the apparatus is detecting IR data, and the detected ambient light signal when the apparatus is detecting ambient light, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller.

15. The IC chip of claim 14, wherein the single time division multiplexing filter is configured to:
    pass the detected IR proximity signal when the mobile device is sensing proximity,
    pass the detected IR data signal when the mobile device is sensing IR data, and
    pass the detected ambient light signal when the mobile device is sensing ambient light.

16. A single integrated circuit (IC) chip of a mobile device to transmit an IR proximity signal and an IR data signal, the IC chip comprising:
    an emitter of IR radiation configured to transmit an IR proximity signal and IR data signals; and
    a sensor configured to detect the IR proximity signal from the emitter when the IC chip is sensing proximity, to detect the IR data signals when the mobile device is detecting IR data, and to detect an ambient light signal when the IC chip is sensing ambient light, the detected ambient light signal being processed by a processor of the mobile device to operate the mobile device, wherein each of the IR proximity signal, the IR data signal, and the ambient light signal are in a different frequency band; and
    a single time division multiplexing filter coupled to the sensor and configured to demodulate and pass the detected IR proximity signal when the apparatus is sensing proximity, the detected IR data signal when the apparatus is detecting IR data, and the detected ambient light signal when the apparatus is detecting ambient light, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller.

17. The IC chip of claim 16, wherein the IR data signal comprises an IR remote control (IRRC) signal and an IR data association (IRDA) signal.

18. A mobile phone comprising:
    an integrated sensor; and
    an integrated wireless transceiver configured to transmit and receive RF data when the phone is communicating by telephony;
    wherein the integrated sensor is configured to detect RC commands from a remote control (RC) signal to control remotely the phone, wherein the integrated sensor comprises an emitter of an IR proximity signal and a receiver to detect the IR proximity signal, wherein each of the RC signal and the IR proximity signal are in a different frequency band, and wherein the detected RC signals are demodulated by a single time division multiplexing filter coupled to the integrated sensor to extract data from the RC signal, the extracted data being processed to control remotely the phone at the same time as the IR proximity signal is processed to operate the phone, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller.

19. The phone of claim 18, wherein the integrated sensor is configured to detect IR data association (IRDA) signals to provide data to the phone.

20. The phone of claim 18, wherein the phone includes personal digital assistant (PDA) capabilities.

21. The phone of claim 18, wherein the phone comprises at least one of a portable device and a hand held phone, wherein the transceiver comprises a wireless cellular transceiver.

22. The apparatus of claim 3, further comprising a decoder or demodulator to decode or demodulate the IR data signal, wherein the decoded IR data signal includes control commands that cause the apparatus to perform an act, and wherein the IR data signal includes audio, images, or video media and causes the apparatus to store, save, play, or display the media.

23. The method of claim 10, further comprising a decoder or demodulator to decode or demodulate the IRRC signal and the IRDA signal, wherein the decoded IRRC signal includes control commands that cause the integrated sensor and emitter device to perform an act, and wherein the IRDA signal includes audio, images, or video media and causes the integrated sensor and emitter device to store, save, play, or display the media.

24. A mobile apparatus to sense proximity, to sense infrared (IR) data signals, and to sense ambient light, the apparatus comprising:
    an emitter of an IR proximity signal;
    a sensor configured to detect the IR proximity signal from the emitter when the apparatus is sensing proximity, to detect an IR data signal when the apparatus is detecting IR data, and to detect an ambient light signal when the apparatus is sensing ambient light, wherein each of the IR proximity signal, the IR data signal, and the ambient light signal are in a different frequency band;
    a single time division multiplexing filter coupled to the sensor and configured to demodulate and pass the detected IR proximity signal when the apparatus is sensing proximity, the detected IR data signal when the apparatus is detecting IR data, and the detected ambient light signal when the apparatus is detecting ambient light, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller;
    a processor coupled to the single time division multiplexing filter to process the IR data signal, the IR proximity signal, and the ambient light signal to operate the mobile apparatus, wherein the processor automatically alters a background brightness of a display in response to processing the detected ambient light signal.

25. A method of operating an integrated sensor and emitter device of a mobile device to sense proximity, to sense infrared (IR) data signals, and to sense ambient light, the method comprising the mobile device:
  emitting an IR proximity signal from an emitter;
  detecting the IR proximity signal from the emitter with a sensor when the integrated sensor and emitter device is sensing proximity;
  detecting an IR data signal with the sensor when the integrated sensor and emitter device is detecting IR data and demodulating the detected IR data signals to extract data from the IR data signal, the extracted data being processed to operate the apparatus;
  filtering, by a single time division multiplexing filter coupled to the sensor, the IR data signal to pass the IR data signals for processing;
  filtering, by the single time division multiplexing filter coupled to the sensor, the IR proximity signal to pass the IR proximity signal for processing while filtering the IR data signal to pass the IR data signal; and
  detecting an ambient light signal with the sensor when the integrated sensor and emitter device is sensing ambient light, the mobile device automatically taking a device action in response to detecting the detected ambient light signal;
  wherein each of the IR proximity signal, the IR data signal, and the ambient light signal are in a different frequency band, and
  wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller.

26. A mobile apparatus to sense proximity, to sense infrared (IR) data signals, and to sense ambient light, the apparatus comprising:
  an emitter of an IR proximity signal;
  a sensor configured to detect the IR proximity signal from the emitter when the apparatus is sensing proximity, to detect an IR data signal when the apparatus is detecting IR data, and to detect an ambient light signal when the apparatus is sensing ambient light, wherein each of the IR proximity signal, the IR data signal, and the ambient light signal are in a different frequency band;
  a single time division multiplexing filter coupled to the sensor and configured to demodulate and pass the detected IR proximity signal when the apparatus is sensing proximity, the detected IR data signal when the apparatus is detecting IR data, and the detected ambient light signal when the apparatus is detecting ambient light, wherein the single time division multiplexing filter comprises a programmable filter coupled to the sensor, a programmable demodulator/amplitude detector coupled to the programmable filter, a timing sequence controller coupled to the programmable demodulator/amplitude detector, and a microcontroller coupled to the timing sequenced controller; and
  a processor coupled to the single time division multiplexing filter to process the IR proximity signal, the IR data signal, and the ambient light signal to operate the mobile apparatus, wherein the processor automatically alters a background brightness of a display in response to processing the detected ambient light signal.

27. A method of operating an integrated sensor and emitter device of a mobile device to sense proximity, to sense infrared (IR) data signals, and to sense ambient light, the method comprising the mobile device:
  emitting an IR proximity signal from an emitter;
  detecting the IR proximity signal from the emitter with a sensor when the integrated sensor and emitter device is sensing proximity;
  detecting an IR data signal with the sensor when the integrated sensor and emitter device is detecting IR data;
  detecting an ambient light signal with the sensor when the integrated sensor and emitter device is sensing ambient light;
  passing the IR proximity signal, the IR data signal, and the ambient light signal through a single time division multiplexing filter coupled to the sensor to pass the detected IR proximity signal when the apparatus is sensing proximity, the detected IR data signal when the apparatus is detecting IR data, and the detected ambient light signal when the apparatus is detecting ambient light, wherein passing the IR proximity signal, the IR data signal, and the ambient light signal through the single time division multiplexing filter further comprises:
    selecting between a frequency band of the detected IR proximity signal, a frequency band of the IR data signal, and a frequency band of the ambient light signal,
    selecting between a period of time of the detected IR proximity signal, a period of time of the IR data signal, and a period of time of the ambient light signal, and
    demodulating the period of time of the detected IR proximity signal, the period of time of the IR data signal, and the period of time of the ambient light signal; and
  processing the IR proximity signal, the IR data signal, and the ambient light signal using a processor of the mobile device to operate the mobile device and to automatically alter a background brightness of a display in response to processing the detected ambient light signal.

28. The apparatus of claim 1, wherein the ambient light signal is processed to determine a light level value that represents ambient light levels at wavelengths other than IR.

29. The apparatus of claim 1, wherein the ambient light signal is processed to determine a light level value for light at wavelengths within a visible frequency band or wavelengths less than a threshold visible light frequency.

30. The apparatus of claim 1, further comprising:
  a cover over the emitter and the sensor; and
  a non-IR transmissive fence between the emitter and the sensor, the fence being configured to prevent the cover from refracting the IR proximity signal directly between the emitter and the sensor.

* * * * *